(12) United States Patent
 Rauwolf et al.

(10) Patent No.: US 12,283,457 B2
(45) Date of Patent: Apr. 22, 2025

(54) MULTIPLE PARTICLE BEAM MICROSCOPE AND ASSOCIATED METHOD WITH AN IMPROVED FOCUS SETTING TAKING INTO ACCOUNT AN IMAGE PLANE TILT

(71) Applicant: Carl Zeiss MultiSEM GmbH, Oberkochen (DE)

(72) Inventors: Nicole Rauwolf, Birkhausen (DE); Nico Kaemmer, Koenigsbronn (DE); Michael Behnke, Eislingen (DE); Ingo Mueller, Aalen (DE); Dirk Zeidler, Oberkochen (DE); Arne Thoma, Heidenheim (DE); Christof Riedesel, Aalen (DE); Gunther Scheunert, Muenster (DE)

(73) Assignee: Carl Zeiss MultiSEM GmbH, Oberkochen (DE)

( * ) Notice: Subject to any disclaimer, the term of this patent is extended or adjusted under 35 U.S.C. 154(b) by 389 days.

(21) Appl. No.: 17/582,504

(22) Filed: Jan. 24, 2022

(65) Prior Publication Data
US 2022/0246388 A1    Aug. 4, 2022

(30) Foreign Application Priority Data

Jan. 29, 2021 (DE) .......................... 102021200799.6

(51) Int. Cl.
  *H01J 37/21* (2006.01)
  *G01N 21/95* (2006.01)
  *H01J 37/26* (2006.01)
(52) U.S. Cl.
  CPC .......... *H01J 37/21* (2013.01); *G01N 21/9501* (2013.01); *H01J 37/26* (2013.01)

(58) Field of Classification Search
 None
 See application file for complete search history.

(56) References Cited

U.S. PATENT DOCUMENTS 4,130,761 A    12/1978 Matsuda
4,153,843 A    5/1979 Pease
(Continued)

FOREIGN PATENT DOCUMENTS

DE   10 2013 014 976 A1   3/2015
DE   10 2013 016 113 A1   3/2015
(Continued)

OTHER PUBLICATIONS

German Office Action, with translation thereof, for corresponding DE Appl No. 10 2021 200 799.6, dated Aug. 24, 2021.
(Continued)

*Primary Examiner* — Eliza W Osenbaugh-Stewart
(74) *Attorney, Agent, or Firm* — Fish & Richardson P.C.

(57) ABSTRACT

A multiple particle beam microscope and an associated method set a desired focal plane with an optical resolution and set a telecentric irradiation with the plurality of the primary beams. A method determines an optimal setting plane, into which an object surface is brought. Further, a system provides an improved resolution and telecentric irradiation for a large number of primary beams. Targeted selection and targeted individual influencing of individual primary beams and/or a mechanism means for influencing the plurality of primary beams in collective fashion can be implemented.

16 Claims, 13 Drawing Sheets

(56) References Cited

U.S. PATENT DOCUMENTS

| | | |
|---|---|---|
| 4,200,794 A | 4/1980 | Newberry |
| 4,338,548 A | 7/1982 | Bono |
| 4,742,234 A | 5/1988 | Feldman |
| 5,215,623 A | 6/1993 | Takahashi |
| 5,864,142 A | 1/1999 | Muraki |
| 5,892,224 A | 4/1999 | Nakasuji |
| 5,905,267 A | 5/1999 | Muraki |
| 5,981,954 A | 11/1999 | Muraki |
| 6,107,636 A | 8/2000 | Muraki |
| 6,124,599 A | 9/2000 | Muraki |
| 6,137,113 A | 10/2000 | Muraki |
| 6,323,499 B1 | 11/2001 | Muraki |
| 6,333,508 B1 | 12/2001 | Katsap |
| 6,617,595 B1 | 9/2003 | Okunuki |
| 6,633,366 B2 | 10/2003 | De Jager |
| 6,696,371 B2 | 2/2004 | Butschke |
| 6,787,780 B2 | 9/2004 | Hamaguchi |
| 6,804,288 B2 | 10/2004 | Haraguchi |
| 6,818,911 B2 * | 11/2004 | Tamamori ............... B82Y 40/00 250/492.22 |
| 6,835,508 B2 | 12/2004 | Butschke |
| 6,872,950 B2 | 3/2005 | Shimada |
| 6,903,345 B2 | 6/2005 | Ono |
| 6,903,353 B2 | 6/2005 | Muraki |
| 6,917,045 B2 | 7/2005 | Hashimoto |
| 6,919,574 B2 | 7/2005 | Hashimoto |
| 6,943,349 B2 | 9/2005 | Adamec |
| 6,953,938 B2 | 10/2005 | Iwasaki |
| 6,992,290 B2 | 1/2006 | Watanabe |
| 7,005,658 B2 | 2/2006 | Muraki |
| 7,015,467 B2 | 3/2006 | Maldonado |
| 7,060,984 B2 | 6/2006 | Nagae |
| 7,084,411 B2 | 8/2006 | Lammer-Pachlinger |
| 7,091,504 B2 | 8/2006 | Wieland |
| 7,109,494 B2 | 9/2006 | Ono |
| 7,126,141 B2 | 10/2006 | Ono |
| 7,129,502 B2 | 10/2006 | Kruit |
| 7,244,949 B2 | 7/2007 | Knippelmeyer et al. |
| 7,285,779 B2 | 10/2007 | Litman |
| 7,375,326 B2 | 5/2008 | Sender |
| 7,420,164 B2 | 9/2008 | Nakasuji |
| 7,468,507 B2 | 12/2008 | Rogers |
| 7,504,622 B2 | 3/2009 | Elyasaf |
| 7,535,001 B2 | 5/2009 | Sender |
| 7,601,972 B2 | 10/2009 | Nakasuji |
| 7,619,203 B2 | 11/2009 | Elyasaf |
| 7,696,497 B2 | 4/2010 | Rogers |
| 8,035,082 B2 | 10/2011 | Yamazaki |
| 8,134,135 B2 | 3/2012 | Kruit |
| 8,350,214 B2 | 1/2013 | Otaki |
| 8,362,425 B2 | 1/2013 | Han |
| 8,384,051 B2 | 2/2013 | Ozawa |
| 8,598,525 B2 | 12/2013 | Zeidler |
| 8,618,496 B2 | 12/2013 | Wieland |
| 8,704,192 B2 | 4/2014 | Sano |
| 8,748,842 B2 | 6/2014 | Ohashi |
| 8,779,399 B2 | 7/2014 | Yamanaka |
| 8,829,465 B2 | 9/2014 | Tsunoda |
| 8,963,099 B2 | 2/2015 | Yamada |
| 9,099,282 B2 | 8/2015 | Rogers et al. |
| 9,153,413 B2 | 10/2015 | Almogy |
| 9,263,233 B2 | 2/2016 | Zeidler |
| 9,336,981 B2 | 5/2016 | Knippelmeyer |
| 9,336,982 B2 | 5/2016 | Zeidler |
| 9,349,571 B2 | 5/2016 | Kemen |
| 9,368,314 B2 | 6/2016 | Nakasuji |
| 9,530,613 B2 | 12/2016 | Rogers |
| 9,536,702 B2 | 1/2017 | Lang |
| 9,607,805 B2 | 3/2017 | Liu |
| 9,653,254 B2 | 5/2017 | Zeidler |
| 9,702,983 B2 | 7/2017 | Eder |
| 9,922,799 B2 | 3/2018 | Li |
| 9,991,089 B2 | 6/2018 | Mueller |
| 10,062,541 B2 | 8/2018 | Ren |
| 10,141,160 B2 | 11/2018 | Ren |
| 10,354,831 B2 | 7/2019 | Kemen |
| 10,388,487 B2 | 8/2019 | Zeidler |
| 10,535,494 B2 | 1/2020 | Zeidler |
| 10,541,112 B2 | 1/2020 | Schubert |
| 10,586,677 B1 | 3/2020 | Okada |
| 10,600,613 B2 | 3/2020 | Zeidler |
| 10,622,184 B2 | 4/2020 | Knippelmeyer |
| 10,643,820 B2 | 5/2020 | Ren |
| 10,741,355 B1 | 8/2020 | Zeidler |
| 10,811,215 B2 | 10/2020 | Zeidler |
| 10,854,423 B2 | 12/2020 | Sarov |
| 10,879,031 B2 | 12/2020 | Ren |
| 10,896,800 B2 | 1/2021 | Riedesel |
| 2004/0164831 A1 * | 8/2004 | Martin ................. H01F 7/20 336/61 |
| 2006/0071166 A1 | 4/2006 | Sato et al. |
| 2009/0014649 A1 | 1/2009 | Nakasuji |
| 2010/0282956 A1 * | 11/2010 | Kimba .................. G01N 23/00 250/252.1 |
| 2014/0197325 A1 | 7/2014 | Kato |
| 2015/0069235 A1 | 3/2015 | Kemen et al. |
| 2015/0083911 A1 | 3/2015 | Zeidler et al. |
| 2015/0357157 A1 | 12/2015 | Mueller et al. |
| 2016/0203948 A1 | 7/2016 | Huynh et al. |
| 2017/0117114 A1 | 4/2017 | Zeidler |
| 2017/0133198 A1 | 5/2017 | Kruit |
| 2019/0172675 A1 | 6/2019 | Masnaghetti et al. |
| 2019/0333732 A1 | 10/2019 | Ren |
| 2019/0355544 A1 | 11/2019 | Riedesel et al. |
| 2020/0126751 A1 * | 4/2020 | Kemen ................. H01J 37/07 |
| 2020/0211810 A1 | 7/2020 | Zeidler |
| 2020/0243300 A1 | 7/2020 | Zeidler |
| 2020/0286707 A1 | 9/2020 | Johannes et al. |
| 2020/0373116 A1 | 11/2020 | Zeidler |
| 2021/0005423 A1 | 1/2021 | Zeidler |
| 2021/0035773 A1 | 2/2021 | Zeidler |

FOREIGN PATENT DOCUMENTS

| | | |
|---|---|---|
| DE | 10 2014 008 383 A1 | 12/2015 |
| DE | 10 2020 125 534 B3 | 12/2021 |
| GB | 2519511 A | 4/2015 |
| GB | 2521819 A | 7/2015 |
| JP | 59184524 A | 10/1984 |
| JP | 60042825 A | 3/1985 |
| JP | 60105229 A | 6/1985 |
| JP | 61263217 A | 11/1986 |
| JP | 2014229481 A | 12/2014 |
| WO | WO 2005/024881 A2 | 3/2005 |
| WO | WO 2007/028595 A2 | 3/2007 |
| WO | WO 2007/028596 A1 | 3/2007 |
| WO | WO 2007/060017 A2 | 5/2007 |
| WO | WO 2011/124352 A1 | 10/2011 |
| WO | WO2013032949 A1 | 3/2013 |
| WO | WO2020057678 A1 | 3/2020 |
| WO | WO2020064035 A1 | 4/2020 |
| WO | WO2020065094 A1 | 4/2020 |
| WO | WO2020070074 A1 | 4/2020 |
| WO | WO2020151904 A2 | 7/2020 |
| WO | WO2020249147 A1 | 12/2020 |
| WO | WO 2021/156198 A1 | 8/2021 |
| WO | WO 2021/239380 A1 | 12/2021 |

OTHER PUBLICATIONS

The Netherlands Search Report and Written Opinion, with translation thereof, for corresponding NL Appl No. 2030761, dated Dec. 12, 2023.

* cited by examiner

MULTIPLE PARTICLE BEAM MICROSCOPE AND ASSOCIATED METHOD WITH AN IMPROVED FOCUS SETTING TAKING INTO ACCOUNT AN IMAGE PLANE TILT

CROSS-REFERENCE TO RELATED APPLICATION

This application claims benefit under 35 U.S.C. § 119 to German Application No. 10 2021 200 799.6, filed Jan. 29, 2021. The contents of this application is hereby incorporated by reference in its entirety.

FIELD

The disclosure relates to multiple particle beam microscopes for inspecting semiconductor wafers with HV structures.

BACKGROUND

With the continuous development of ever smaller and ever more complex microstructures such as semiconductor components, there is a desire to develop and optimize planar production techniques and inspection systems for producing and inspecting small dimensions of the microstructures. By way of example, the development and production of the semiconductor components involves monitoring of the design of wafers, and the planar production techniques involve process monitoring and a process optimization for a reliable production with a high throughput. Moreover, there have been recent demands for an analysis of semiconductor wafers for reverse engineering and for a customer-specific, individual configuration of semiconductor components. Therefore, there is a desire for inspection approaches which can be used with a high throughput for examining the microstructures on wafers with a great accuracy.

Typical silicon wafers used in the production of semiconductor components have diameters of up to 300 mm. Each wafer can be subdivided into 30 to 60 repeating regions ("dies") with a size of up to 800 mm$^2$. A semiconductor apparatus can include a plurality of semiconductor structures, which are produced on a surface of the wafer in layers by planar integration techniques. Semiconductor wafers typically have a plane surface on account of the production methods. The structure sizes of the integrated semiconductor structures in this case general extend from a few μm to the critical dimensions (CD) of 5 nm, wherein the structure dimensions will become even smaller in the near future; in future, structure sizes or critical dimensions (CD) are expected to be less than 3 nm, for example 2 nm, or even under 1 nm. In the case of the small structure sizes, defects of the size of the critical dimensions can be identified quickly in a very large area. For several applications, the desired accuracy of a measurement provided by an inspection device are even higher still, for example by a factor of two or one order of magnitude. By way of example, a width of a semiconductor feature is measured with an accuracy of below 1 nm, for example 0.3 nm or even less, and a relative position of semiconductor structures is determined with a superposition or overlay accuracy of below 1 nm, for example 0.3 nm or even less.

The multi-beam scanning electron microscope is a relatively new development in the field of charged particle systems (charged particle microscopes, CPMs). By way of example, a multi-beam scanning electron microscope is disclosed in U.S. Pat. No. 7,244,949 B2 and in US 2019/0355544 A1. In the case of a multi-beam electron microscope or MSEM, a sample is irradiated simultaneously with a plurality of individual electron beams, which are arranged in a field or grid. By way of example, 4 to 10,000 individual electron beams can be provided as primary radiation, with each individual electron beam being separated from an adjacent individual electron beam by a pitch of 1 to 200 micrometers. By way of example, an MSEM has approximately J=100 separated individual electron beams ("beamlets"), which for example are arranged in a hexagonal grid or raster, with the individual electron beams being separated by a pitch of approximately 10 μm. The plurality of J charged individual particle beams (primary beams) are focused on the surface of a sample to be examined by way of a common objective lens. By way of example, the sample can be a semiconductor wafer which is fastened to a wafer holder that is assembled on a movable stage. During the illumination of the wafer surface with the primary individual particle beams, interaction products, for example secondary electrons or backscattered electrons, emanate from the surface of the wafer. Their start points can correspond to those locations on the sample on which the plurality of J primary individual particle beams are focused in each case. The amount and the energy of the interaction products can depend on the material composition and the topography of the wafer surface. The interaction products can form a plurality of secondary individual particle beams (secondary beams), which are collected by the common objective lens and which are directed at a detector arranged in the detection plane as a result of a projection imaging system of the multi-beam inspection system. The detector can include a plurality of detection regions, each of which includes a plurality of detection pixels, and the detector measures an intensity distribution for each of the J secondary individual particle beams. A digital image of an image field of for example 100 μm×100 μm can be obtained in the process.

Known multi-beam electron microscopes can include a sequence of electrostatic and magnetic elements. At least some of the electrostatic and magnetic elements can be adjustable in order to adapt the focus position and the stigmation of the plurality of charged individual particle beams. A known multi-beam system with charged particles can include at least one crossover plane of the primary or the secondary charged individual particle beams. Moreover, such a known system can include detection systems to make the setting easier. A known multi-beam particle microscope can include at least one beam deflector ("deflection scanner") for collective scanning of a region of the sample surface using the plurality of primary individual particle beams. The plurality of the primary beams can be fully swept in parallel over the image field of the sample surface. Moreover, a known system can include a beam divider arrangement which is configured such that the bundle of the primary beams is guided from the generation device of the bundle of the primary beams to the objective lens, and the bundle of the secondary beams is guided from the objective lens to the detection system.

Further, DE 10 2014 008 383 A1 has disclosed that a change in only one particle-optical property of a multi-beam electron microscope can be attained by way of a complicated interdependence of the setting parameters of a plurality of particle-optical components. Particularly in the case of a relatively large change of the imaging scale of the multi-beam electron microscope, for example, it can be desirable to change the setting parameters (for example currents) of a plurality of particle-optical components in order to keep other properties such as the relative position of the image plane, image rotation and the telecentricity or convergence of the individual beamlets constant at the same time as changing the imaging scale. To this end, a matrix A which describes the effects of the change in the setting parameters on the particle-optical properties of the multi-beam electron microscope can be determined. By way of example, this matrix A, also referred to as sensitivity matrix, can be determined by measurements. To this end, DE 10 2014 008 383 A1 describes a number of suitable test patterns.

Further details regarding a multi-beam electron microscope and a method for operating same are described in WO 2021 239380 A1, the disclosure of which is incorporated in full in this patent application by reference.

In the case of scanning electron microscopes for wafer inspection, it is often desirable to keep the imaging conditions stable such that the imaging can be carried out with great reliability and high repeatability. The throughput can depend on a plurality of parameters, for example the speed of the stage and of the realignment at a new measurement sites, and the area measured per unit of capture time. The latter can be determined, inter alia, by the dwell time on a pixel, the pixel size and the number of individual particle beams. Additionally, time-consuming image postprocessing may be desired for a multi-beam electron microscope; by way of example, the signal generated from charged particles by the detection system of the multi-beam system is digitally corrected before the image field from a plurality of image sub-fields or sub-fields is put together ("stitching").

Known methods for determining and setting a best focal plane of the plurality of the primary beams can have a negative effect on the throughput. By way of example, U.S. Pat. No. 10,388,487 describes a determination of object properties in a first measurement with first setting parameters and a derivation of second setting parameters resulting therefrom in order to measure the object therewith in a second measurement. Beam properties such as the focal position and stigmation, for example, are determined from the object properties. However, this method can reduce the throughput since a first measurement precedes a second, improved measurement with a higher resolution. By contrast, U.S. Pat. No. 9,099,282 proposes setting an ideal focal plane with additional astigmatic primary beams. This process, too, may no longer ensure an ideal setting of the best focal plane, especially in the case of a relatively large plurality of primary beams, since aberrations of the beam-optical system at the edge of the image field, where the additional beams are arranged, prevent a precise measurement of the best relative focal position.

SUMMARY

Against the above-described background and the increasing demands on throughput/speed and on precise measurements of ever smaller structures, there is a desire to improve existing systems. This applies in particular to the inspection of polished wafer surfaces with HV structures. Thus—even under the not entirely realistic assumption of a lack of system drift and the like—it may no longer be sufficient to set the multiple electron microscope at a predefined working point with an associated working distance using the methods from the prior art. Instead, the optimal focal plane for a plurality of primary beams can be set with greater precision since very small changes in the optimal focal plane in a multi-beam microscope with a large image field of approximately 100 μm lead to a loss of resolution.

The present disclosure seeks to provide a multiple particle beam system that operates with charged particles and an associated method for operating same with a high throughput, which facilitates a highly precise measurement of semiconductor features with a resolution of below 4 nm, below 3 nm or even below 2 nm.

Previous methods for determining and setting a best focal plane of the plurality of the primary beams can have a negative effect on the attainable resolution, and may lead to a disadvantageous distribution of the resolution over the image field of the plurality of the primary beams. In this case, optimal focal plane means that the first plane, into which an object is brought using the stage. By way of example, the aforementioned U.S. Pat. No. 10,388,487 assumes a simple curved image surface. Recent investigations have shown that only considering the curved image surface is no longer sufficient to reliably fulfil a resolution of below 5 nm, for example below 4 nm or even 3 nm. In addition to a curved image surface error, an image field tilt, for example, can limit the obtainable resolution, for example in the case of a relatively large number of primary beams for a higher throughput. In addition to an image field tilt, it can be desirable to consider a telecentricity error or an error as a result of an angle deviation of the plurality of the primary beams from the perpendicular to an object surface.

The present disclosure seeks to provide an improved multiple particle beam system for inspecting semiconductor wafers with HV structures and an associated method for operating same. The latter desirably operates quickly and very precisely over a large image field. A multiple particle beam system for inspecting semiconductor wafers is a charged particle beam system utilizing in parallel a plurality of charged particle beams for the inspection of an inspection site of a semiconductor wafer.

The disclosure also seeks to provide a multiple particle beam system for inspecting semiconductor wafers with HV structures and an associated method for operating the same, which facilitates an improved setting of the focal plane and hence an improved resolution. In this case, other particle optical parameters such as the magnification, the telecentricity and the rotation should be kept constant with great precision. The disclosure further seeks to provide a multiple particle beam system which facilitates highly precise and high-resolution image recording with a large image field and with a resolution below 5 nm (e.g., below 4 nm, below 3 nm) and desirably with a high throughput.

The disclosure seeks to make available at an improved control system of a multiple particle beam microscope which facilitates the more precise setting of the focal plane. The disclosure seeks to provide an improved beam-optical system of a multiple particle beam microscope, which facilitates an improved constant resolution of a measurement of a planar sample with a resolution below 5 nm or even below 3 nm.

The setting the focal plane is that of observing further conditions and specifications for a high resolution, which is generally desired to be as uniform as possible, can be below 5 nm, below 4 nm or even below 3 nm. The landing angle of the individual particle beams on the sample are for example be virtually perpendicular to the sample. Further, the orientation of the grid arrangement of the primary beams on the sample surface can be kept precise since semiconductor wafers have systematic and repeating structures, for which a measurement result should always be obtained with the same quality. The optical unit of the secondary path for imaging of the secondary charged particles can also be considered in order to obtain excellent imaging.

In an aspect, the disclosure provides a system and method for determining deviations in the beam directions of the plurality of primary beams of a multi-beam microscope caused by manufacturing tolerances. In certain embodiments, the disclosure can provide a system and method for determining a mean beam direction of the plurality of primary beams of a multi-beam microscope in relation to a mechanical reference. In some embodiments, the disclosure can provide a system and method for aligning a displacement stage for receiving the sample or the wafer, relative to the mean beam direction of the plurality of primary beams of the multi-beam microscope.

An improvement in precision and resolution can be achieved by an improved method and improved system for even more precise setting of the focal plane, and so a resolution of a measurement, which is as uniform as possible, of a planar sample with a resolution below 5 nm, below 4 nm or even below 3 nm is facilitated within a large image field of greater than 100 µm.

The disclosure provides method for setting a best focal plane for a multi-beam particle microscope with a plurality of J primary beams, wherein the plurality of J primary beams are arranged in a grid arrangement and each primary beam can be deflected in each case over an associated sub-field in an image field by way of a scan deflector, including the step A of positioning a surface of an object using a displacement stage or a positioning device in a first setting plane with a first z-position $z(i)=z1$.

The method can further include the step B of determining suitable parameters for a focusing series, wherein step B can include the following elements:
  the determination of a suitable image section within each of the J sub-fields;
  the selection of L selected image sections from the image sections of the J sub-fields, where $L<=J$ is chosen; and wherein a selected primary beam is assigned to each of the L selected image sections;
  the definition of parameters for an acquisition of the digital image data and for the measurement of contrast measures of the sections of the surface of the object arranged within the selected image sections; and further
  the definition of a series of P increments $dz(i)$ with i=2 to P, $dz(i)=dz(2)$ to $dz(P)$.

By way of step B, it can be ensured that the determination of the optimal setting plane is able to be adapted to a surface condition or to structures on the surface of an object such as a wafer, for example. In the case of a wafer inspection task, for example, the structures on the surface of the wafer may be known as a result of CAD information or design information or previous measurements, and the parameters for the focusing series for determining the optimal setting plane can be adapted to the information known in advance.

The method can further include the step C of measuring L contrast measures $K1(i)$ to $KL(i)$ for each of the $i=1$ to P z-positions. In this case, step C includes the elements of:
  acquiring J digital image data of the J image sections within each of the J sub-fields in accordance with the parameters defined in step B;
  evaluating the L selected image sections and determining $l=1$ to L contrast measures $K1(i), \ldots, KL(i)$ in accordance with the parameters selected in step B;
  transmitting the L contrast measures $K1(i)$ to $KL(i)$ to a control unit and storing the L contrast measures $K1(i)$ to $KL(i)$.

In this case, the capture of L contrast measures can be implemented within a short period of time in relatively small image sections and only for selected image sections, and hence the throughput in a wafer inspection task, for example, can be increased.

The method can further include step D of changing the first setting plane into a second or further setting plane at a second or further z-position $z(i+1)=z(i)+dz(i)$. In one example the increments $dz(i)$ between two z positions are the same or identical, but the increments $dz(i)$ between two z-positions can also be chosen differently.

The method can further include step E of repeating steps C and D until a minimum number of the focusing series of increments has been reached and at least P contrast values $Kl(1), \ldots Kl(P)$ have been determined for each of the L selected image sections. Overall, a total number of L×P contrast measures is determined for L selected image sections at P different z-positions.

Here, in step E, a check can be carried out as to whether the contrast measures are sufficient and allow a determination of the optimal focal plane according to the subsequent steps, or whether there has to be a further determination of contrast measures at a further z-position. In this case, the series of z-positions can be increased by at least one to $P1=P+1$.

The method can further include a step F of determining a best focal position for each of the L primary beams which are assigned to one of the selected image sections, and determining a curved image surface error and an image plane tilt from the L best focal positions.

The method can further include a step G of determining an optimal focal plane such that a predefined resolution criterion is met for the greatest possible number of the plurality of J primary beams.

The method can further include a step H of changing and storing the optimal focal plane as a new first setting plane of the multi-beam particle microscope such that the surface of an object once again comes to rest in the new first setting plane.

In some embodiments, the method includes determining the upper and lower admissible focal deviations of the L selected primary beams, wherein the upper and lower admissible focal deviations may be different on account of aberrations for the various primary beams. This can ensure that a predetermined resolution criterion for the calculation of the optimal focal plane is met to the best possible extent for the greatest possible number of primary beams.

In some embodiments, the parameters for measuring contrast measures include a selection of the method for determining a contrast measure. A method for determining a contrast measure can be one of the following methods: a spectral method, an image contrast, a histogram method, an edge filter, a method of a relative distribution, or a gradient method. Optionally, different methods can also be combined with one another. By way of example, the selection can be implemented on the basis of a priori information about the structures of the object or of the wafer located in the selected image sections.

The number L of a selected image sections is, in general, at least four, but no more than J/2, in an example. In an example, the number L of selected sections contains four to seven selected sections and four to seven assigned primary beams. This can ensure that a curved image surface error and an image plane tilt can be reliably determined, for example by approximating an off-centered spherical surface to the four to seven ideal focal positions of the four to seven assigned primary beams. In an example, the number P of contrast values ranges between P=3 and P=7, or $2<P<8$. This can ensure that a parabolic or hyperbolic profile of a resolution over a z-position can be detected and an optimal focal position can be determined for each primary beam, for example by a parabolic approximation.

The series of P increments dz(i) can include different or identical increments dz(i) and can be selected with advance information. By way of example, should it be suspected that a best focal plane is only a short distance away from the current z-position of the substrate surface, it is possible to choose a relatively short series with smaller and constant increments dz(i)=dz, for example with P=3 to 5. If the z-position of the best focal plane is unknown, it is possible to choose a larger series, for example with P=>5, and the increments can be chosen to be greater and different, for example a middle increment dz(4) can be chosen to be shorter than an outer increment dz(1) or dz(7) in the case of P=7.

In an example, the number L of selected image sections is restricted in accordance with an available computational power of a data acquisition device of the multi-beam microscope. By way of example, the data of the plurality of the J secondary beams is acquired using a parallel computer architecture, for example using R image digitizers connected in parallel, wherein each of the image digitizers acquires the data of a plurality of assigned secondary beams. In an example, J=100 and R=10, and the number L of the selected image sections is chosen with L<=10 less than or equal to R=10. In other examples, the number R is a certain division ratio with respect to the number J of primary beams, for example R>J/U, where U corresponds to the maximum number of the secondary beams which can be captured by one of the image digitizers and which are assigned to one image digitizer. Optionally, U=10 or less, for example 8 or 6.

In an example, the first setting plane in step D is changed by changing the actuation of an objective lens. In an example, the first setting plane is changed in step D by changing the z-position of the surface of an object by way of the displacement stage, which is moved by an actuator. In an example, the first setting plane in step D is changed by changing the actuation of an objective lens and by changing the position of the surface of the object by way of the displacement stage.

In an example, the change in the actuation of an objective lens includes changing two actuation signals such that the sum of the squares of a first and a second current remains constant and the difference of the squares of the first and the second current is changed. Hence, a constant heat output of the objective lens can be ensured and a particularly precise setting of an optimal focal plane is facilitated.

In an example, an actuation signal for a compensator for an image plane tilt is determined from the image plane tilt determined in step F and is fed to a compensator for an image field tilt. In an example, an actuation signal for a compensator for a curved image surface error is determined from the curved image surface error determined in step F and is fed to the compensator for a curved image surface error.

In an example, a displacement vector is determined in step G, the displacement vector describing the offset for the grid arrangement of the primary beams in order to increase the number of primary beams which meet a predefined resolution criterion. In an example, the number of primary beams corresponds to the plurality J>90, and all J>90 primary beams meet a predefined resolution criterion of for example below 4 nm, such as below 3 nm.

In an aspect, the disclosure provides a multi-beam particle microscope which is configured in a first mode of operation to ascertain a digital image of a section of an object surface arranged in an image field of the multi-beam particle microscope and is configured in a second mode of operation to carry out one of the methods described in the first embodiment for setting a best focal plane. The multi-beam particle microscope includes a data acquisition device and a scan deflector which are configured to be able to be switched from the first mode of operation into the second mode of operation. By way of the parallel switching of the data acquisition device and of the scan deflector from a first into a second mode of operation, the multi-beam particle microscope is configured either to perform an image recording in the first mode of operation or to determine an optimal setting plane in the second mode of operation. The measurement system for determining the optimal setting plane corresponds to the image recording system including a detector and data acquisition device. The multi-beam particle microscope further includes an actuation system which includes at least a displacement stage and an objective lens. In an example, the multi-beam particle microscope further includes at least a compensator for an image plane tilt or a compensator for a curved image surface error. In an example, the multi-beam particle microscope further includes at least a compensator for a tilt of the primary beams or a telecentricity error, or a tilt device for a displacement stage.

In an aspect, the disclosure provides a multi-beam particle microscope including a multi-beam generation device, a beam divider and an objective lens with an axis of symmetry of the objective lens, wherein the multi-beam generation device generates a plurality of J primary beams in a grid arrangement and wherein the intersection points of the grid arrangement of the plurality of J primary beams in a first setting plane are offset by a displacement vector in relation to the axis of symmetry. In an example, the multi-beam generation device has at least one multi-aperture plate with a plurality of openings for generating the plurality of J primary beams, wherein the at least one multi-aperture plate is arranged with a lateral offset such that the intersection points of the grid arrangement of the plurality of J primary beams in a first setting plane are offset by the displacement vector in relation to the axis of symmetry. In an example, the multi-beam particle microscope includes at least one first deflector which, when in operation, is configured to collectively laterally offset the plurality of J primary beams in the first setting plane by the displacement vector. An effect of an image plane tilt on the resolution of the plurality of the primary beams can be reduced by the displacement of the grid arrangement of the primary beams.

In an aspect, the disclosure provides a multi-beam particle microscope including a multi-beam generation device, a beam divider and an objective lens with an axis of symmetry of the objective lens, and a positioning device for positioning an object, wherein the positioning device includes a changeable tilt device and the multi-beam particle microscope further includes a second deflector in the vicinity of an intermediate image plane of a plurality of J primary beams, the second deflector being configured, when in operation, to change an angle of incidence of the plurality of the J primary beams on a surface of an object situated on a positioning device such that the angle of incidence of the primary beams on the sample surface is virtually perpendicular when tilting the positioning device via the tilt device. This can ensure that a telecentric or perpendicular illumination of the object surface by way of the plurality of the primary beams can be maintained, even in the case of variable compensation of a changeable image plane tilt by way of tilting the displacement stage.

In an aspect, the disclosure provides a changeable compensator for an image plane tilt which includes a plurality of J openings in a grid configuration in the xy-plane, which openings are configured, when in operation, to influence a plurality of J primary beams in the grid configuration, wherein each of the plurality of the J openings is provided with at least one electrode which is configured, when in operation, to change a focal position of a primary beam passing through the opening in the z-direction. The plurality of the electrodes are designed and interconnected such that for each primary beam there is a change in focal plane as a linear function of, for example, a y-position of the respective primary beam, wherein the change in the focal plane is constant in the x-direction transverse thereto. Hence, a tilt of an image plane can be kept available in the generation device of the primary beams in a simple and effective manner by way of only one actuation signal and, for example, can be adapted to a change during use the image plane tilt.

In some embodiments, a multi-beam particle microscope can include a multi-beam generation device, a beam divider and an objective lens, wherein the multi-beam generation device further includes a compensator for an image plane tilt, which has a plurality of J openings in a grid configuration in a xy-plane, which openings are configured, when in operation, to influence a plurality of J primary beams in the grid configuration, wherein each of the plurality of the J openings is provided with at least one electrode which is configured, when in operation, to change a focal plane of a primary beam passing through the opening in the z-direction, wherein the plurality of the electrodes are designed such that there is for each primary beam a change in focal plane as a linear function in a first transverse direction of the respective primary beam, wherein the change in focal plane in a second transverse direction, which runs perpendicular to the first transverse direction, is constant. In this case, the orientation of the xy-plane of the compensator for the image plane tilt can be designed to keep available a predetermined rotation of the grid configuration of the primary beams by the objective lens when in operation. In an example, the image plane tilt is set by the compensator as a function of the voltage or kinetic energy with which the plurality of the primary beams pass through the beam divider. In the method, an image plane tilt can be compensated, which is induced by the beam divider and which is dependent on the kinetic energy of the plurality of the primary beams.

In an aspect, a multi-beam particle microscope includes an objective lens for precisely focusing a plurality of J primary beams with passive cooling, wherein the objective lens includes a first coil with a first resistance R1 and a second coil with a second resistance R2, and wherein the objective lens is configured, when in operation, to be operated with a first current I1 and a second current I2, wherein the heat output $Q=I1^2*R1+I2^2*R2$ is constant. A change in the focal plane is set by way of the difference of the two currents I1 and I2 and the magnetic fluxes generated thereby in the coils. In this case, the magnetic flux of the second coil runs against the direction of the magnetic flux of the first coil. In an example, the second coil extends counter to the first coil. In an example, the objective lens further includes a heat sink in the form of a contact to a cooling mechanism or a coolant. This method can ensure that a focusing effect of the objective lens can be set precisely and, in particular, is not subject to thermal changes or variations.

In an aspect, the disclosure relates to a calibration method for calibrating a multi-beam particle microscope with a plurality of J primary beams. A calibration method with which the deviation from a telecentric property and the mean beam angle are determined is provided in the seventh embodiment, including the step A of positioning a surface of an object in a first setting plane with a first z-position $z(i)=z1$ using a displacement stage or positioning device. In an example, the object is a calibration object which is arranged on the displacement stage, for example. In another example, the object is a sample to be examined, for example a wafer.

In an example, the calibration method additionally contains the elements of steps B to H, similar to the steps of the first embodiment, and reference is made to the description of the first embodiment.

The calibration method can further include in step B the determining of suitable parameters for a focusing series, wherein step B includes the following elements:
the determination of a suitable image section within each of J sub-fields;
the selection of L selected image sections from the image sections for each of the J sub-fields, where $L<=J$ is chosen; and wherein a selected primary beam is assigned to each of the L selected image sections;
the definition of parameters for an acquisition of the digital image data, and further
the definition of a series of P increments $dz(i)$ with $i=1$ to P, $dz(i)=dz(1)$ to $dz(P)$.

Step B can ensure that the determination of a telecentricity error can be achieved. In the case of a wafer inspection task, for example, the structures on the surface of the wafer may be known from CAD information or design information or previous measurements, and the parameters for the focusing series for determining the telecentricity error can be adapted to the information known in advance. By way of example, in the case of the calibration on the basis of a calibration object, the CAD information or design information of the calibration object is known and image sections can be chosen accordingly.

The method can further include in step C the acquisition of L digital image data for each of the $i=1$ to P z-positions. In this case, step C includes the elements of:
acquiring J digital image data of the J image sections within each of the J sub-fields in accordance with the parameters defined in step B;
storing the digital image data in a memory unit.

The calibration method further includes a step T, including the determination of a relative lateral offset from the stored image data of an l-th selected image section over at least two different focal positions or z-positions and the determination of an l-th beam angle of an l-th primary beam assigned to the I-th selected image section, from the relative lateral offset and the distance between the z-positions. In an example, the relative lateral offset is determined between two digital image data of a selected image section by way of a correlation.

The calibration method further includes a step Y, including an evaluation of the beam angles of the plurality of the primary beams and a determination of a telecentricity error of the multi-beam particle microscope. A particularly precise and fast method for determining the telecentricity error can be obtained with the calibration method according the seventh embodiment. However, it is also possible to determine further beam aberrations.

In an example, a mean beam angle of the primary beams is determined, and the relative deviations of the beam angles at least of selected primary beams from the mean beam angle is determined.

In an example, information is derived from the determined telecentricity error and fed to a control unit of the multi-beam microscope. In an example, the information includes control variables for at least partial compensation of a telecentricity error. In an example, a control variable includes at least one control signal for an objective lens, a beam divider, a deflector, or for a displacement stage.

In an example, the calibration method additionally includes a step W, including at least one change in the relative position of the sample surface or of the setting plane for the purposes of determining a cause of a telecentricity error, for example. By way of example, a telecentricity error can have the following causes: a tilt of the optical axis of the objective lens, a tilt of a component of the objective lens, an off-centered beam path of a charged particle beamlet through electromagnetic elements of the multi-beam particle microscope, a wedge angle in a sample or a wafer, a tilt of the displacement stage or a z-axis of the displacement stage.

In an example, step W includes further changes for calibrating optical components of the multi-beam microscope. The actuation signals of a static deflector are changed in an example. The effect of a static deflector can be calibrated therewith, for example.

In an example, a first calibration method according the seventh embodiment is carried out on a calibration object, followed by a second calibration method according the seventh embodiment being carried out on a sample or a wafer. In this way, it is possible to capture and take account of a wedge angle of a sample, for example.

In an example, the calibration method further includes the determination of a z-profile of selected primary beams, including at least a determination of a variable selected from an optimal focal position of a selected primary beam, a z-extent a focal region of a selected primary beam, a minimum spot extent, or an upper z-position of a focal region or a lower z-position of a focal region of a selected primary beam. The method can include storing the determined variables in the control unit of the multi-beam microscope. In an example, the calibration method includes the determination of a curved image surface error and an image plane tilt. In this way, it is possible for example to capture the focal regions of the selected primary beams and use these for subsequent, model-based calculation of a best setting plane according the method of the first embodiment.

A multi-beam particle microscope with a plurality of J primary beams according any one of the embodiments can contain a controller or computer system, configured to operate the multi-beam particle microscope in a first or in a second mode of operation. In this case, the multi-beam particle microscope includes a data acquisition device which includes a first plurality J of detectors, which are coupled to a second plurality of R image digitizers connected in parallel, and a collective beam deflector including electromagnetic deflection elements and scanning electronics. In the first mode of operation, the controller can control an image data acquisition with the data acquisition device and the collective scan deflector to capture a digital image of a contiguous section of a substrate surface. In the second mode of operation the controller can control a measurement member including the data acquisition device and the collective beam deflector. Further, the controller controls a position controlling element for positioning the first setting plane. The computer system of the controller can contain processors and memory, which are suitable for carrying out an algorithm for determining the optimal focal plane. Appropriate software code for carrying out the second mode of operation, as discussed herein, can be stored in the memory of the controller. In a specific example, a final controlling element is provided by the objective lens. Additional final controlling elements, for example a first, static deflector, a second, static deflector or compensator for an image plane tilt, can likewise be provided.

In an example, a data acquisition device with the second plurality of R image digitizers connected in parallel is configured to be able to be switched from the first to the second mode of operation. In the first mode of operation, the data acquisition device with the second plurality of R image digitizers connected in parallel can be configured to acquire and store a plurality of image data points for capturing the digital image of the contiguous section of the substrate surface, wherein the digital image includes J sub-fields which adjoin one another and at least partly overlap one another, with each of the J sub-fields being assigned to one of the J primary beams. In the second mode of operation, the data acquisition device with the second plurality of R image digitizers connected in parallel can be configured to acquire image data points of L selected sections and calculate contrast measures from the image data points of the L selected sections.

Optionally, no additional measurement member is involved. By way of the switchable configuration of the controller, the data acquisition device and the collective scan deflector, the data acquisition device and the collective scan deflector can be both an element for capturing a digital image of a section of a substrate surface and an element of the measurement member. The measurement member can be configured to generate measurement data for determining an ideal or optimal focal plane. However, compared with certain known systems and methods, no astigmatic auxiliary beams are used for setting the focus. Hence, an optimal setting of the focal plane can be set for imaging with the desired resolution of for example below 5 nm, such as below 4 nm or even lower.

Further, in addition to the curved image surface error, the image plane tilt of a multi-beam particle microscope with a beam divider can be measured as a function of the operating conditions of the multi-beam particle microscope. In this case, the operating conditions can include the kinetic energy of the primary beams, the setting of the imaging scale or of the numerical aperture of the multi-beam particle microscope, or the particle current.

Depending on the manner of evaluation, the autofocus algorithm can be configured to calculate an optimal focal plane from the measurement data and to generate a focus correction element control signal on the basis of the optimal focal plane in order to drive the objective lens or the displacement stage, for example. As a result, the relative position of the first setting plane, in which the surface of the wafer is positioned with the displacement stage, can be changed. The actuation of the objective lens can be implemented in such a way that a change in focus is attained in the object lens with a constant heat generation. Positioning the displacement stage may include a tilt of the displacement stage. Once these settings have been implemented for the primary path, the secondary path can be updated.

The disclosure can ensure that an image plane or first setting plane is determined and set in optimal fashion such that with a plurality of primary beams a predefined resolution of below 5 nm (e.g., below 4 nm, below 3 nm) can be achieved for a large number J>90 of primary beams. By combining the embodiments, it is possible in particular to increase the plurality of the primary beams with J>90, wherein simultaneously a uniform resolution of below 4 nm or even below 3 nm is achieved by way of all J>90 primary beams.

The above-described embodiments of the disclosure can be combined with one another in full or in part, provided that no technical contradictions arise as a result.

BRIEF DESCRIPTION OF THE DRAWINGS

The disclosure will be understood even better with reference to the accompanying figures, in which.

DETAILED DESCRIPTION

Below, the same reference signs denote the same features, even if these are not explicitly mentioned in the text.

Figure 1:
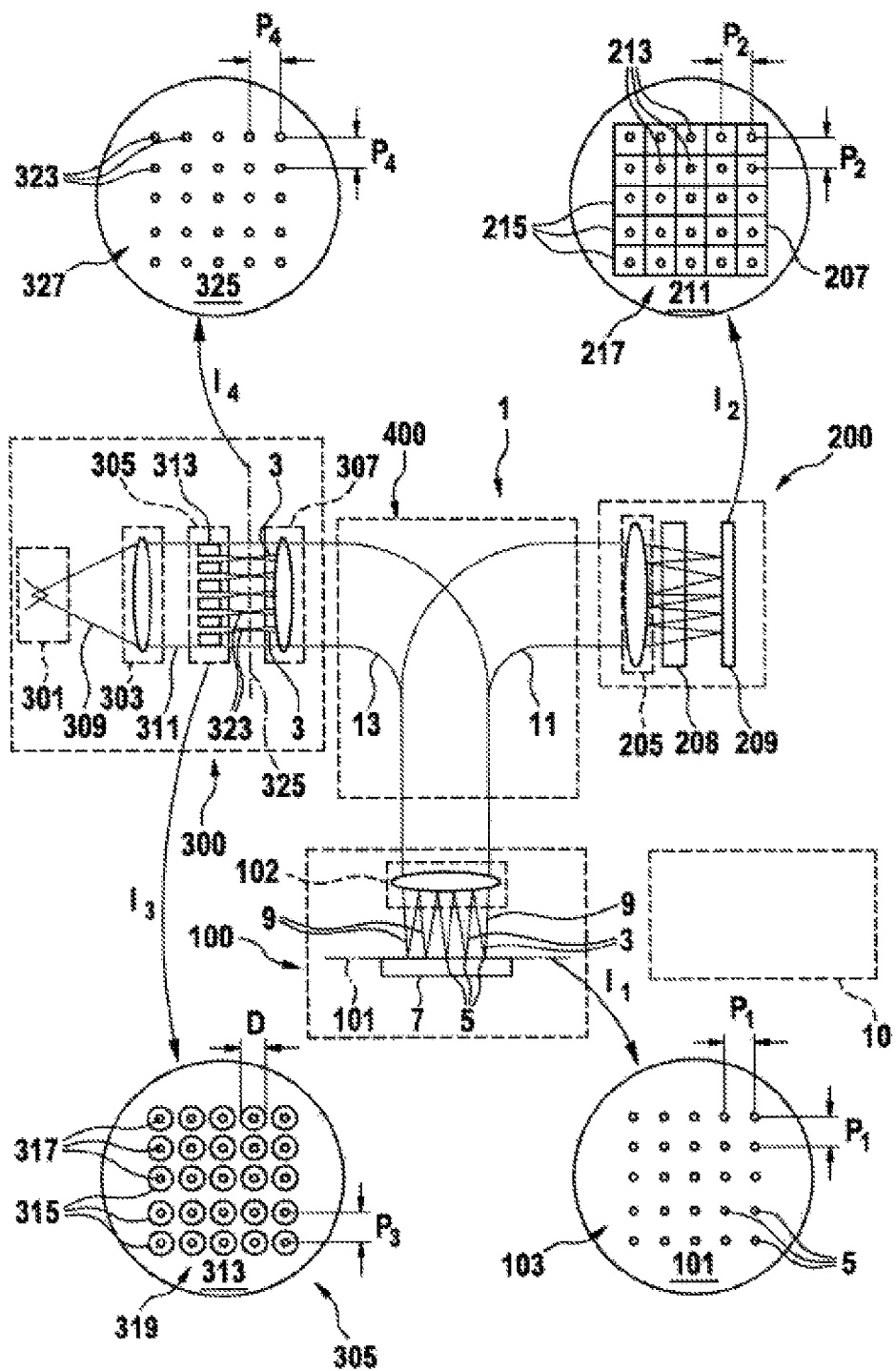
FIG. 1 shows a schematic illustration of a multi-beam particle microscope.

FIG. 1 is a schematic illustration of a particle beam system 1 in the form of a multi-beam particle beam system 1, which uses a plurality of particle beams. The particle beam system 1 generates a plurality of J particle beams 3 which strike an object 7 to be examined in order to generate there interaction products, e.g., secondary electrons, which emanate from the object 7 and are subsequently detected. The particle beam system 1 is of the scanning electron microscope (SEM) type, which uses a plurality of primary particle beams 3 which are incident on a surface of the object 7 at a plurality of locations and generate there a plurality of electron beam spots, or spots 5, that are spatially separated from one another. The object 7 to be examined can be of any desired type, e.g., a semiconductor wafer, in particular a semiconductor wafer with HV structures (i.e., with horizontal and/or vertical structures), or a biological sample, and can include an arrangement of miniaturized elements or the like. The surface of the object 7 is arranged in a first plane 101 (object plane) of an objective lens 102 of an objective lens system 100.

The enlarged detail $I_1$ in FIG. 1 shows a plan view of the first plane or object plane 101 having a regular rectangular field or grid arrangement 103 of incidence locations 5 formed in the first plane 101. In FIG. 1, the number of incidence locations is twenty-five, which form a 5×5 field 103. The number J=25 of incidence locations is a number chosen for reasons of simplified illustration. In practice, the number of beams J, and hence the number of incidence locations, can be chosen to be significantly greater, such as, for example, J=10×10, J=20×30 or J=100×100

In the embodiment illustrated, the field 103 of incidence locations or focal points 5 is a substantially regular rectangular field having a constant pitch $P_1$ between adjacent incidence locations. Exemplary values of the pitch $P_1$ are 1 micrometer, 10 micrometers or 40 micrometers. However, it is also possible for the grid arrangement 103 to have other symmetries, for example a hexagonal symmetry or an arrangement of the individual beams in a radial arrangement.

A diameter of the minimal beam spots or focal points 5 shaped in the first plane 101 can be small. Exemplary values of this diameter are below 4 nanometers, for example 3 nm or less. The focusing of the primary particle beams 3 for shaping the beam spots 5 is carried out by the objective lens system 100, for example. In this case, the objective lens system 100 can include a magnetic immersion lens 102, for example. Further examples of focusing mechanisms are described in the German patent DE 102020125534 B3 and in PCT/EP2021/025359, filed on Sep. 22, 2021, the entire contents of which is herewith incorporated in the disclosure.

The primary particles 3 striking the object 7 generate interaction products, e.g., secondary electrons, back-scattered electrons or primary particles that have experienced a reversal of movement for other reasons, which emanate from the surface of the object 7. The interaction products emanating from the surface of the object 7 are shaped by the objective lens 102 to form secondary particle beams 9. The particle beam system 1 provides a particle beam path 11 for guiding the plurality of secondary particle beams 9 to a detector system 200. The detector system 200 includes a particle optical unit with at least one projection lens 205 for directing the secondary particle beams 9 toward a particle multi-detector 209.

The detail $I_2$ in FIG. 1 shows a plan view of the plane 211, in which individual detection regions of the particle multi-detector 209 on which the secondary particle beams 9 are incident at locations 213 are located. The incidence locations 213 lie in a field 217 with a regular pitch $P_2$ with respect to one another. Exemplary values of the pitch $P_2$ are 10 micrometers, 100 micrometers or 200 micrometers.

The primary particle beams 3 are generated in a beam generation apparatus 300 including at least one particle source 301 (e.g., an electron source), at least one collimation lens 303, a multi-aperture arrangement 305 and a field lens 307, or a field lens system made of a plurality of field lenses. The particle source 301 generates at least one diverging particle beam 309, which is collimated or at least substantially collimated by the at least one collimation lens 303 in order to shape a beam 311 which illuminates the multi-aperture arrangement 305.

The detail $I_3$ in FIG. 1 shows a plan view of the multi-aperture arrangement 305. The multi-aperture arrangement 305 includes at least one multi-aperture plate 313, which has a plurality of openings or apertures 315 in the grid arrangement 319 formed therein. Midpoints 317 of the openings 315 are arranged in the grid arrangement 319 that is imaged onto the field 103 formed by the focal points 5 in the object plane 101. A pitch $P_3$ between the midpoints 317 of the apertures 315 can have exemplary values of 5 micrometers, 100 micrometers or 200 micrometers. The diameters D of the apertures 315 are smaller than the pitch $P_3$ between the midpoints of the apertures. Exemplary values of the diameters D are $0.2 \times P_3$, $0.4 \times P_3$ or $0.8 \times P_3$.

Particles of the illuminating particle beam 311 pass through the J apertures 315 and form the plurality J of primary beams 3. Particles of the illuminating beam 311 which strike the plate 313 are absorbed by the latter and do not contribute to the formation of the primary beams 3.

On account of an applied electrostatic field, the multi-aperture arrangement 305 focuses each of the primary beams 3 in such a way that beam focal points 323 are formed in an intermediate image plane 325. Alternatively, the beam foci 323 can be virtual. A diameter of the beam foci 323 can be, for example, 10 nanometers, 100 nanometers and 1 micrometer.

The field lens 307 and the objective lens 102 provide a first imaging particle optical unit for imaging the plane 325, in which the beam foci 323 are formed, onto the first plane 101 such that a field 103 of incidence locations or focal points 5 arises there. Should a surface 15 of the object 7 be arranged in the first plane 101, the focal points 5 are correspondingly formed on the object surface 15 (see also FIG. 3).

The objective lens 102 and the projection lens arrangement 205 provide a second imaging particle optical unit for imaging the first plane 101 onto the detection plane 211. The objective lens 102 is thus a lens or a lens system that is part of both the first and the second particle optical unit, while the field lens 307 belongs only to the first particle optical unit and the projection lens 205 belongs only to the second particle optical unit.

A beam divider 400 is arranged in the beam path of the first particle optical unit between the field lens 307 and the objective lens system 100. The beam divider 400 is also part of the second optical unit in the beam path between the objective lens system 100 and the detector system 200.

Further information relating to such multi-beam particle beam systems and components used therein, such as, for instance, particle sources, multi-aperture plate and lenses, can be obtained from the international patent applications WO 2005/024881, WO 2007/028595, WO 2007/028596, WO 2011/124352 and WO 2007/060017 and the German patent applications having the publication numbers DE 10 2013 016 113 A1, DE10 2014 008 383 A1 and DE 10 2013 014 976 A1, the disclosure of which in the full scope thereof is incorporated by reference in the present application.

The multiple particle beam system furthermore includes a computer system or control system 10 configured both for controlling the individual particle optical components of the multiple particle beam system and for evaluating and analyzing the signals obtained by the multi-detector 209. In this case, the control or controller system 10 can be constructed from a plurality of individual computers or components.

Figure 2:
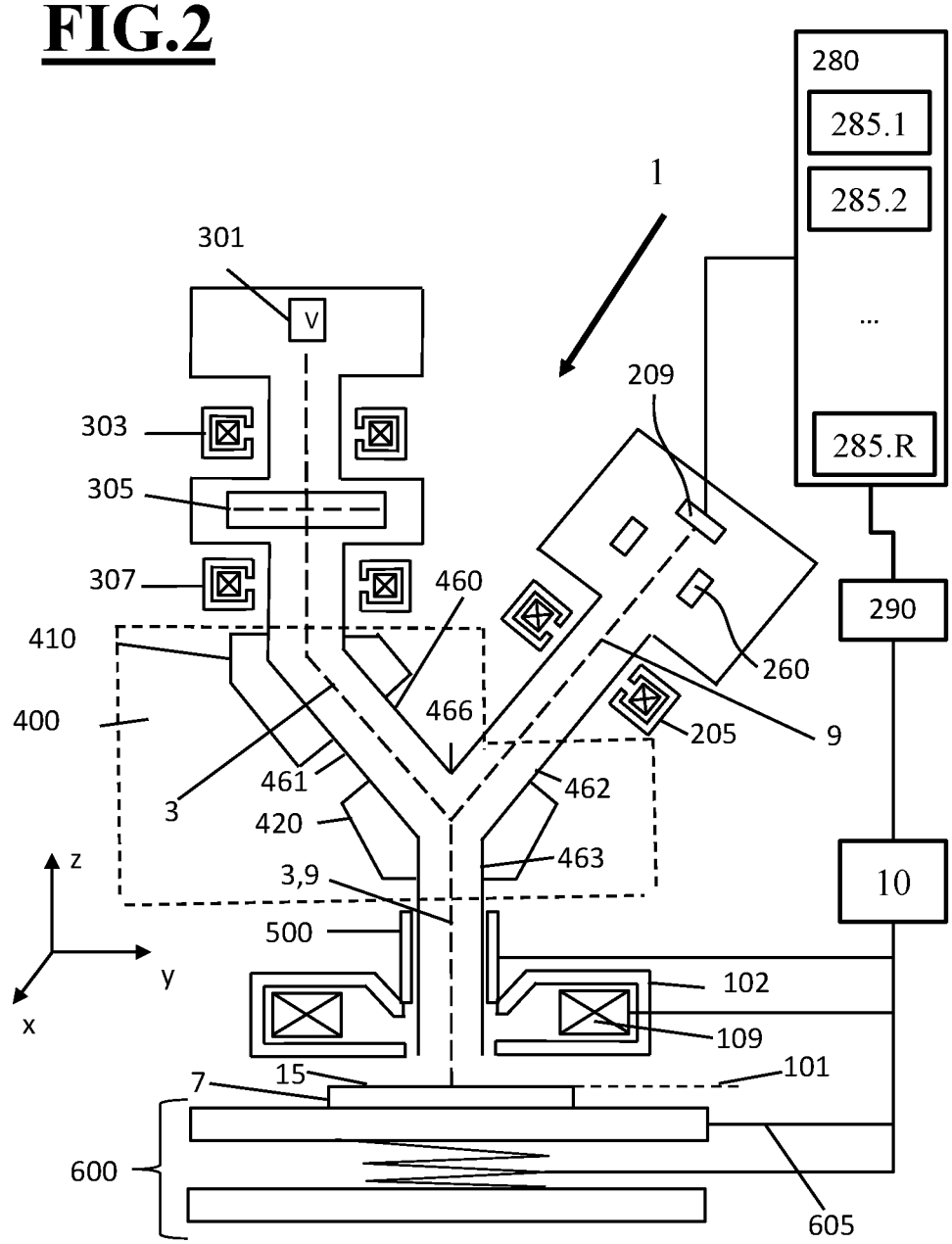
FIG. 2 shows a schematic illustration of a multi-beam particle microscope.

FIG. 2 schematically shows further aspects of the multi-beam particle microscope 1, in particular aspects of the beam divider 400 and a beam deflector 500, using a section through a multi-beam particle microscope 1. A particle optical beam path of the primary beams is illustrated schematically in FIG. 2 by the dashed line with reference sign 3. The particle beam passes through the beam generation apparatus with the magneto-optic condenser lens system 303 and subsequently strikes the multi-aperture arrangement 305. The plurality of the primary beams 3 emanating from the multi-aperture arrangement 305 then pass through a magneto-optic field lens system 307 and subsequently enter the magneto-optic beam divider 400. This beam divider 400 includes a beam tube arrangement 460, which has a Y-shaped embodiment and three limbs 461, 462 and 463 in the example shown. Here, in addition to two flat, interconnected structures for holding the magnetic sectors 410, 420, the beam divider 400 includes the first and second magnetic sectors 410 and 420 which are contained in, or secured to, the structures. After passing through the beam divider 400, the first particle beams pass through a scan deflector 500 and, thereupon, the particle optical objective lens 102, before the primary particle beams 3 are incident on the surface 15 of an object 7, in this case a semiconductor wafer with HV structures. In this case, HV structures denote the predominately horizontal or vertical profile of the semiconductor structures. In this case, the semiconductor wafer 7 is positioned by a displacement stage 600 below the objective lens. The displacement stage can be a 6-axis displacement stage which can position the surface 15 of the sample 7 in the object plane or first plane 101 in 6 degrees of freedom. In this case, the position accuracy in the z-direction is below 50 nm, for example better than 30 nm.

As a result of this incidence of the primary beams 3, secondary particles, e.g., secondary electrons, are released from the object 7. These secondary particles form second particle beams 9, to which the second particle optical beam path 9 is assigned. After emerging from the object 7, the second particle beams 9 initially pass through the particle optical objective lens 102 and subsequently pass through the scan deflectors 500, before the second particle beams enter the beam divider 400. Subsequently, the second particle beams 9 emerge from the beam divider 400, pass through a projection lens system 205 (illustrated in much-simplified fashion), pass through an electrostatic element 260 and then strike a particle-optical detection unit 209. In this case, the electrostatic element 260 describes the so-called anti-scan, which compensates the otherwise arising scanning movement of the secondary beams 9 upon incidence on the detection unit 209.

The detection unit 209 is connected to a data acquisition device 280. The acquisition of data relating to the plurality of the J secondary beams is implemented via a parallel computer architecture, for example. The data acquisition device 280 contains R image digitizers 285.1 to 285.R connected in parallel, which can be designed as R ASICs connected in parallel, for example. Each image digitizer 285.1 to 285.R acquires the analog image data of a plurality of assigned secondary beams detected by the detection unit 209, and transforms these into digital image data. In an example, J=100 and R=10, and signals of 10 secondary beams are assigned to each image digitizer 285.

In a multi-beam particle beam system 1 according FIG. 2, the sample 7 is at a potential which firstly decelerates the primary particles and secondly accelerates the secondary particles out of the sample. To set the sample potential 605, the receiving stage for the sample or the wafer 7 is connected to the control unit 10.

Figure 3:
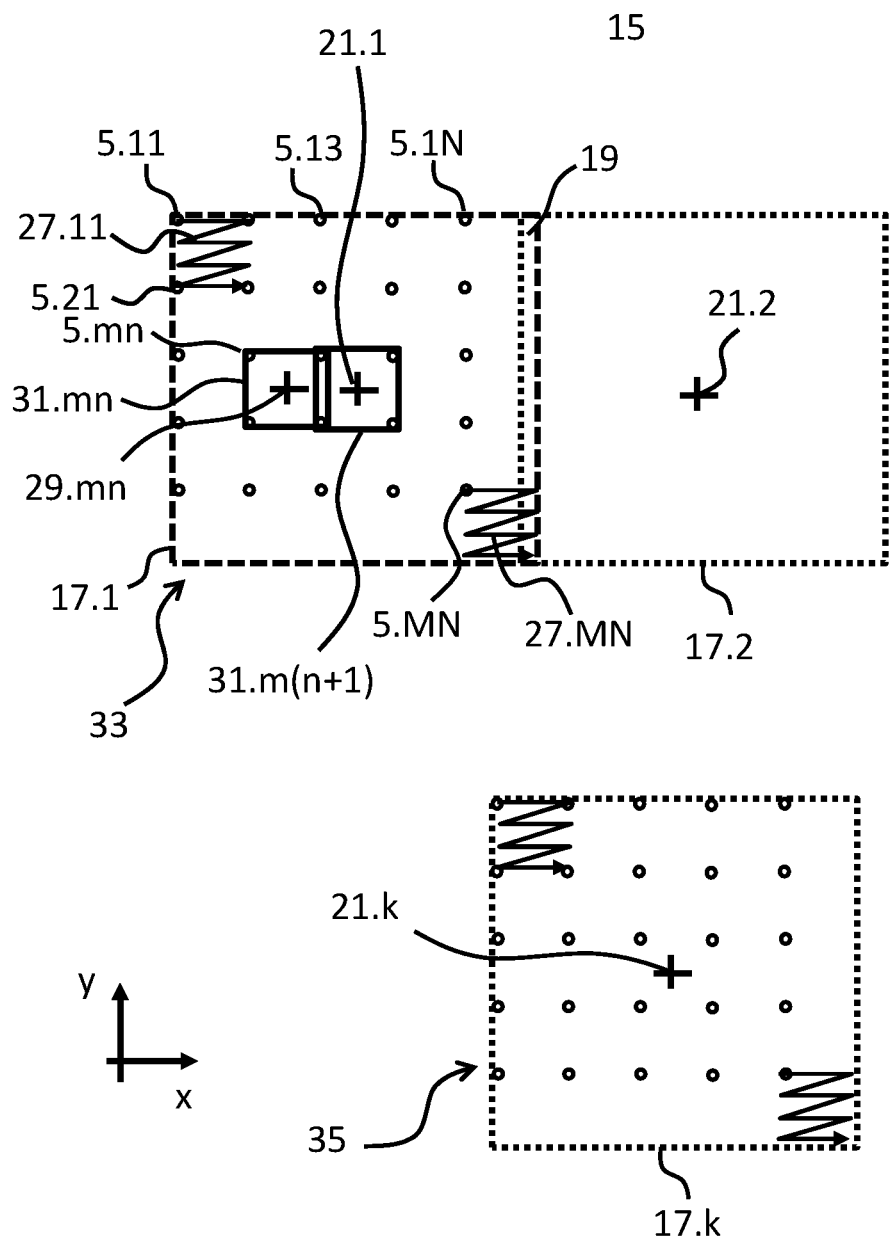
FIG. 3 shows an inspection site on a wafer and a plurality of image fields with sub-fields of a multi-beam particle microscope.

A method of wafer inspection is described with reference to FIG. 3. With its upper side 15, a wafer is arranged in the first plane or object plane 101 of the multi-beam microscope 1. According to the disclosure, the wafer is arranged in the optimal focal plane of the plurality of the primary beams 3 in this case. In this example, the plurality of the primary beams 3 have a rectangular beam grid. The center 21.1 of the first image field 17.1 scanned by the plurality of primary beams 3 is in this case aligned approximately with the axis of symmetry of the objective lens 102. The image fields 17.1 to 17.k correspond to different inspection sites of a wafer inspection task. By way of example, a predefined first inspection site 33 and second inspection site 35 are read from a control file. The first inspection site 33 in this example is divided into a plurality of image fields 17.1 and 17.2, with a first center position 21.1 and a second center position 21.2. Then, the first center position 21.1 of the first image field 17.1 is initially aligned under the axis of the objective lens 102. In this case, methods for detecting a coordinate system of a wafer and aligning a wafer are known from the prior art.

The plurality J of primary beams 3 are then deflected together by the scan deflector 500 over in each case small sub-fields 31.11 to 31.MN and, in the method, each beam scans a different sub-field, for example sub-field 31.*mm* or sub-field 31.*m*(n+1). Exemplary scanning patterns 27.11 and 27.MN are schematically illustrated in the first sub-field 31.11 and in the last sub-field 31.MN. Further, in exemplary fashion, the focal points 5.11, . . . , 5.MN of the respective different primary beams are illustrated in each case at the upper left corner of an assigned sub-field. Further, sub-fields 31 each have a center; the center 29.*mn* of the sub-field 31.*mn* is labeled by a cross in exemplary fashion.

Here, a plurality of sub-fields 31.11, . . . , 31.MN are in each case scanned in parallel by the plurality of the J primary beams with focal points 5.11 to 5.MN and a digital image data record is acquired for each of the J sub-fields 31.11 to 31.MN, each image data record being able to include 8000×8000 pixels, for example. In this case, the pixel size can be defined and be 2 nm×2 nm, for example. However, a different number of pixels between 4000×4000 and more than 10 000×10 000 pixels are also possible, and other pixel sizes of for example 3 nm, 1 nm or less can be set. Once the digital image data of the first image field 17.1 have been acquired, the image data of the individual sub-fields 31.1 to 31.MN of the first image field 17.1 are combined to form an image data record. Subsequently, the second image field 17.2 is positioned under the axis of the objective 102 and the digital image data of the second image field 17.2 are acquired. The procedure is continued, for example with the inspection site 35 with the image field 17.*k*. Naturally, the grid arrangement of the primary beams is not restricted to rectangular grid arrangements; other grid arrangements include, for example, hexagonal grids or an arrangement of the primary beams on concentric rings or one ring. In this case, the lateral resolution of the digital image data is determined substantially by the diameter of the focal points 5 of the primary beams 3 on the object surface 15.

According to a first embodiment of the disclosure, the disclosure provides a method for setting a best focal plane for a multi-beam particle microscope 1.

Figure 4:
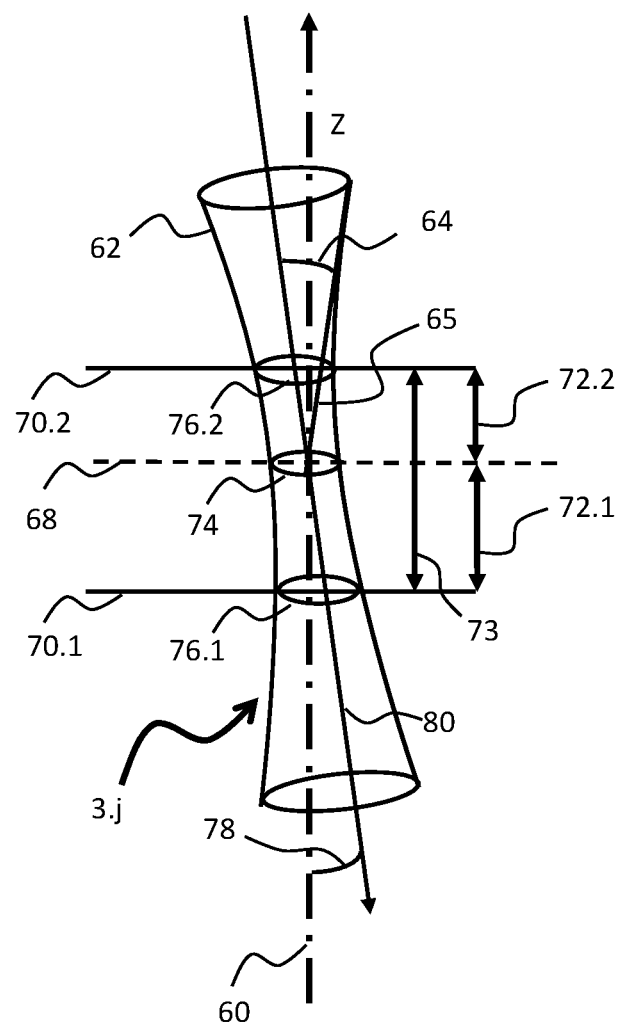
FIG. 4 shows a focal profile of a primary particle beam through a focal plane.

In the multi-beam particle microscope 1, each individual primary beam of the grid arrangement may have a spatial difference along the optical axis between the respective beam waist of an individual primary beam and the sample surface 15 to be imaged. According to the first embodiment, the autofocus method controls this distance such that the generated image becomes optimal. An optimal image generation is understood to mean that a predetermined criterion is met, for example in respect of the resolution. However, other application-relevant image parameters are also conceivable, for example an image fidelity or minimal distortion. FIG. 4 illustrates these circumstances using a simplified example. An individual primary beam 3.*j* of the plurality of the J primary beams propagates counter to the positive z-direction or the z-axis. Additionally, the primary beam 3.*j* can be inclined with respect to a z-axis by a beam angle 78. In this case, the beam angle 78 is determined by the angle between a centroid ray 80 and the z-axis.

The objective lens 102 focuses the beam into a best focal plane 68 of the j-th primary beam 3.*j*. Typically, electron beams in the multi-beam particle microscope have a half opening angle 64 between 8 and 14 mrad, for example a mean half opening angle of 10 mrad. Therefore, in the far field, an individual beam broadens in the direction of the z-axis by approximately 2 nm per 100 nm distance proceeding from the best focal plane. However, the pencil of rays does not have an exact conical behavior but instead has an envelope 62 with an approximately hyperbolic curve, which may additionally be asymmetrical with respect to the best focal plane 68. Proceeding from a best focal plane 68 with a minimum beam diameter 74 of 3 nm, for example, a focal region 73 is therefore obtained, within which a focal diameter remains below a specified threshold 76 of 4 nm or 5 nm, for example. The minimum beam diameter 74 is also referred to as a beam waist. In the example of FIG. 4, the focal region extends from plane 70.1 with a distance 72.1 from the best focal plane 68 to the upper plane 70.2 with a distance 72.2 from the best focal plane 68. The cross sections of the beamlet 76.1 and 76.2 in the lower and upper plane 70.1, 70.2, respectively, have a diameter corresponding to the specified threshold of for example 4 nm or 5 nm. According to the disclosure, an autofocus system is provided which facilitates a setting of the object plane 101, in which the surface 15 of a wafer 7 is arranged, within the focal region 73 for a plurality of primary beams, and which consequently facilitates a resolution that meets the desired resolution for a plurality of beams.

Multi-beam particle microscopes 1 usually have aberrations. By way of example, a multi-beam particle microscope 1 according FIG. 1 typically has a curved image surface. Additionally, a multi-beam particle microscope 1 according FIG. 2 additionally has an image or focus plane tilt. According to the aberrations, the beam waists 74 of the respective primary beams 3.1 to 3.J are at different z-positions. In this case, the autofocus method according to the disclosure of the first embodiment contains methods for choosing an optimum of the first setting plane of a wafer with respect to a plurality of J primary beams 3.

According to the first embodiment, a method is provided for setting an optimal focal plane for a multi-beam particle microscope 1. In this case, the multi-beam particle microscope 1 is characterized by a multi-beam generation device 305 and a detector system 200 with a particle multi-detector 209 and a data acquisition device 280, wherein the multi-beam generation device 305 is configured to generate a first plurality of J primary beams 3 in a grid arrangement and each primary beam can be respectively deflected over an assigned sub-field 31 in an image field 17 by way of a scan deflector 500. The method according the first embodiment includes the steps of:

A. positioning a surface 15 of an object 7 using a displacement stage or a positioning device 600 in a first setting plane 101 with a first z-position z1;

B. determining suitable parameters for a focusing series with z-positions zi with i=1 to P;

C. measuring L contrast measures K1(i=1) to KL(i=1) for L<=J selected primary beams 3;

D. displacing the first setting plane 101 into a second or further setting plane at a second or further z-position z2 to zP;

E. repeating steps C and D until contrast measures K1(i) to KL(i) with i=1 to P are measured for each of the z-positions z1 to zP;

F. determining a best focal position 68 for each of the L selected primary beams 3;

G. determining a curved image surface error and an image plane tilt from the L best focal positions 68 and determining an optimal focal plane of the multi-beam particle microscope 1 such that a predefined resolution criterion is met for a second plurality of J2 primary beams;

H. storing the optimal focal plane as new first setting plane 101 of the multi-beam particle microscope 1.

Figure 5:
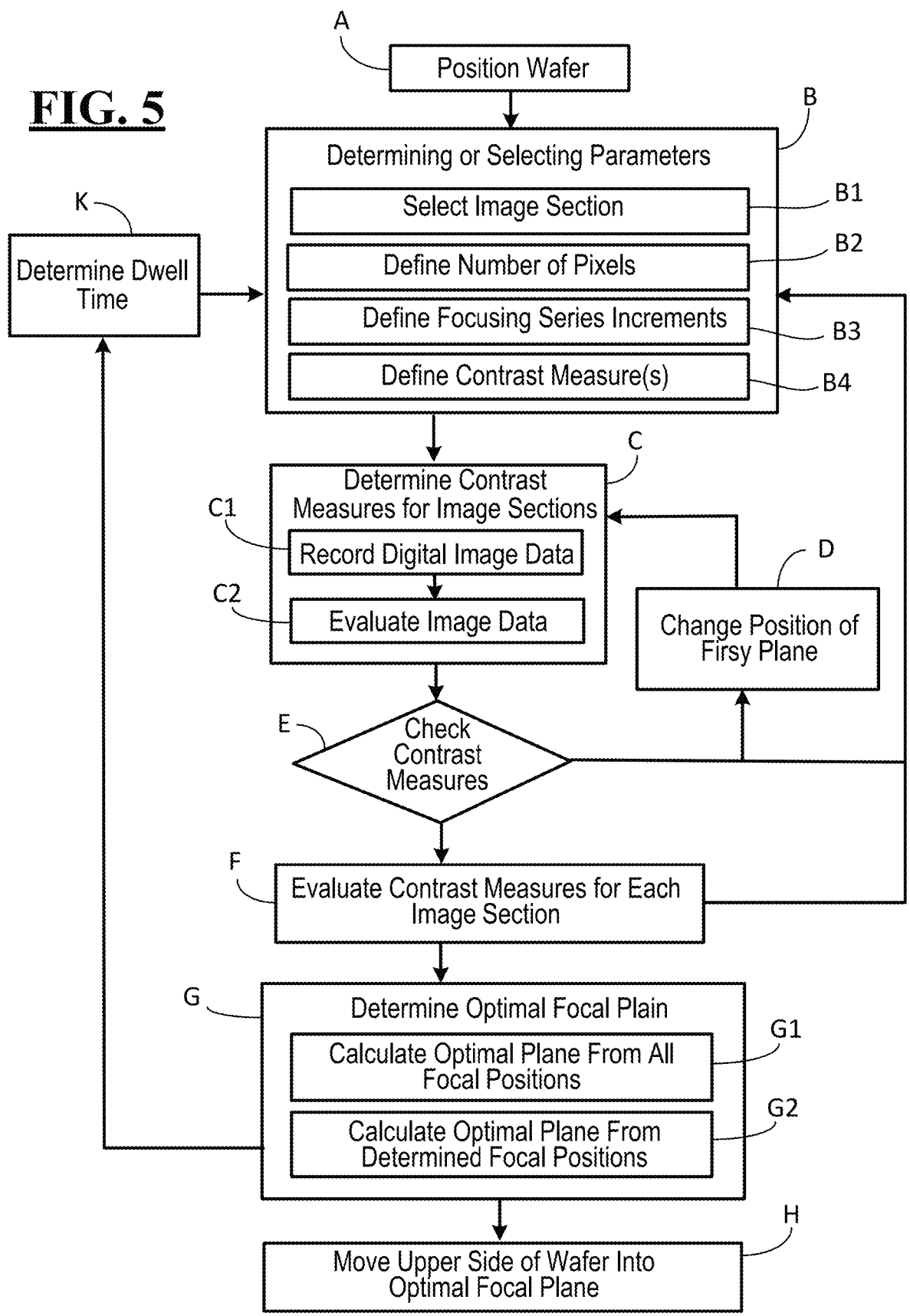
FIG. 5 illustrates a method for setting a best or optimal focal plane.

The method of setting a best focal plane for a multi-beam particle microscope 1 with a plurality of J primary beams according the first embodiment is illustrated in FIG. 5. As explained above, the number J of primary beams in this case can include J=60, J=90 or more beams, for example. During a preceding calibration, the J primary beams 3 are set in relation to a first plane 101 in such a way that they strike the sample in approximately perpendicular fashion. The angle of incidence of the beams is typically less than <10 mrad. At the same time, the first plane 101 is determined in such a way that it ideally corresponds to a predetermined best focal plane. The method for a multi-beam particle microscope 1 allows the determination of a best focal plane for a plurality of primary beams. This contains the acquisition of data from several, selected beams. In an example, the selected beams are chosen such that a field curvature and an image plane tilt are taken into account. In an example, the second plurality J2 of the primary beams with which a predefined resolution can be achieved includes as many primary beams as possible, for example at least 90% of the first plurality J, or J2>=0.9×J. A method with which a predefined resolution can be achieved for all primary beams such that the second plurality J2 equals the first plurality J (J2=J) can be used.

In a first step A of the method, the surface of the wafer 7 is brought into the first plane 101 via the displacement stage 600 and is aligned perpendicular to the primary beams.

In a second step B, a number of parameters for carrying out the method are determined or selected.

Figure 6:
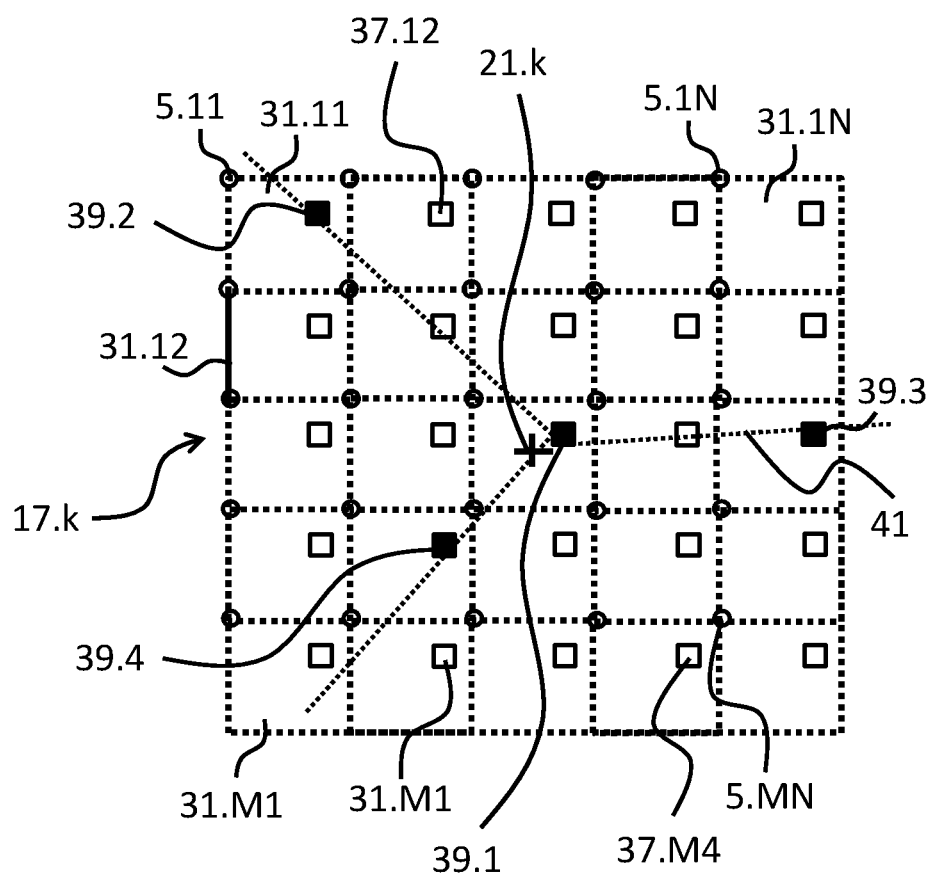
FIG. 6 shows selected image sections in an image field.

In step B1, an image section 37 is selected for a sharpness determination for each primary beam. This is illustrated in FIG. 6 on the basis of an image field 17.K. Here, each image section 37 can be chosen to be substantially smaller than a sub-field 31; by way of example, the image section 37 can be only 256×256 pixels in each case, with a pixel size of 1.5 nm, for example. Larger image sections are also conceivable, for example up to 512×512 pixels. This can ensure that the digital data for determining the focal plane can be recorded as quickly as possible. As illustrated in FIG. 6, the same image section 37.11 to 37.MN is thus defined in each subfield 31.11 to 31.MN (not all sub-fields and image sections are labelled). Further, a predetermined number of L selected image sections 39 is selected from the plurality of the J image sections. The number L of selected image sections can be at least 3, 5, 9 or 12 image sections in this case. FIG. 6 illustrates an example with L=4, with selected image sections 39.1 to 39.4. A larger number L of selected image sections can also be chosen in special cases, for example L=J can be chosen. However, by way of L=1, it is also possible to choose only a single image section.

In the example of FIG. 6, the selected image sections are selected in such a way that a field curvature and an image plane tilt are taken into account with the smallest possible number of selected image sections. A first selected image section 39.1 is near the center of the image field 17.k. A second selected image section 39.2 is at a maximal position of the image field 17.k. A third selected image section 39.3 is located within the image field 17.k at an opposite side to the second image section 39.2. A fourth selected image section 39.4 is located in a zone between the center and maximal position in a sector of the image field opposite to the second image section 39.2 and the third image section 39.3. For elucidation purposes, 3 axes 41 through three non-illustrated sectors are plotted in FIG. 6. The selected image sections are located approximately on the three axes 41, with the axes in this example having an angle with respect to one another of approximately 60° in each case. Alternatively, it is also possible to choose only two axes, which are perpendicular to one another, instead of three axes 41. What generally applies is that selected image sections are located on at least two axes through the image field, wherein at least one first selected image section 39.1 is located on the point of intersection of the at least two axes, at least one second selected image section 39.2 is located at the maximum extent of the image field in the direction of the first axis, and at least one third selected image section 39.4 is located on half to ⅔ of the path between the first selected image section 39.1 and the maximum extent of the image field in the direction of the second axis, with the first and the second axis having an angle of between 70° and 150° with respect to one another. This selection can ensure that the curved image surface and image plane tilt are measured.

In an example, there are no structures facilitating an evaluation under individual primary beams. Then, the assigned image sections are not selected, or the image section is changed. An image section that is evaluable over all selected image sections 39 can either be determined by way of a preceding measurement or determined using a priori information, such as for example design information or CAD data of the wafer to be measured. In an example, the image section 37 is determined within each of the J sub-fields 31 on the basis of a surface condition or on the basis of structures on the surface 15 of the object 7.

The selection of the selected image sections and associated primary beams can include:
- all J image sections of all J sub-fields;
- every 2nd image section, for example arranged in a checkerboard pattern;
- a selected image section, for example in hexagonal grid arrangement, emanating for each of for example five or seven radii intervals from the center 21.k;
- per ring in a circular grid arrangement;
- at least three beams in order to measure the curved image surface (center, zone, edge);
- at least four beams in order to measure the curved image surface and tilt (center, 1×zone, 2×edge, in each case offset from one another by between 70° and 150°);
- in accordance with a number R of parallel image digitizers, with L<=R.

The number L of the selected image sections is at least four (L>=4) in an example. In an example, the data acquisition device 280 has a number R of image digitizers 285.1 to 285.R arranged in parallel, and the number of selected sections L is chosen to be less than or equal to R.

In step B2, the number of pixels S of the image sections for determining the focus and the pixel pitch ds within the image sections are defined. By way of example, the pixel size or pixel pitch ds can be set by the user by way of a user interface. In another example, the pixel size is determined from the structure size within the selected image sections, for example from a priori information such as design information or CAD data of the wafer to be measured. By way of example, a pixel size ds can be determined in accordance with half the value of the structure size, or less, but no smaller than a quarter of the structure size. Additionally, the dwell time can be set in order to reduce the noise. By way of example, a longer dwell time can be set in the case of samples with a very poor sample contrast. By way of example, the dwell time can be set automatically, or the control system can determine a dwell time in step K from a preceding measurement or from a priori information about the expected sample contrast.

For the determination of the contrast measures described below in step C2, it can be desirable to have 2 to the power N, for example 2 to the power 8 pixels (256 pixels or picture elements) in one dimension as the number of pixels for an image section in order to facilitate evaluations using FFT methods. However, smaller image sections of for example 200×200 pixels are also conceivable. In this case, an image section can be increased to for example 256×256 by adding zeros (zero padding) for the purposes of determining the contrast measure.

In step B3, P increments dz1, dz2, ... dzP for a focusing series are defined and a minimum number of contrast measures to be determined is defined. It was found that P=three z-positions is particularly suitable to this end; however, it is also possible to select P=five or more different z-planes such that, for example, contrast measures are determined at five different z-positions for each selected image section.

In a first example, only a small deviation from an ideal focal plane is expected and tighter distances or increments dz1, ... , dzP are chosen accordingly. In the case of relatively large focal deviations, a relatively large measurement region is chosen and the number of z-positions P of the focusing series is increased, for example to five or seven or more.

In an example, the focusing series extends over a z-range of up to 2 μm, but smaller z-ranges and smaller increments can be chosen. In an example, a focusing series has P=5 steps with the same increments dz=125 nm. In this example, the added z-range covers a total of 625 nm. For a reliable evaluation of the contrast measures described further below, the increment dz or the scanned z-range may not be chosen to be too small, however. The z-range should therefore extend over at least 200 nm or an increment dz in the case of only P=3 measurement points of the focusing series should not be less than 200 nm, for example. In an example, a focusing series has at least 3 steps with an increment dz=250 nm, and extends over a total z-range of 750 nm. For a greater accuracy, it is possible to select smaller increments dz1, dz2, ... dzP and choose a larger number P of z-positions, for example P>6, wherein the dwell time is increased at the same time in order to reduce the noise during the determination of the contrast measures described below in step B4. In an example, the number P of z-positions is defined in a range between P=3 and P=7.

In a method according the first embodiment, step B therefore includes the following elements:
 the determination of an image section 37 within each of the J sub-fields 31;
 the selection of L selected image sections 39.1 to 39.L from the image sections 37 for each of the J sub-fields 31, where L<=J is chosen; and wherein a selected primary beam 3 is assigned to each of the L selected image sections 39;
 the definition of parameters for an acquisition of the digital image data of the sections of the surface 15 of the object 7 arranged within the image sections 39;
 the definition of the series of P z-positions z1 to zP with (P−1) increments dz(2) to dz(P) between two successive z-positions z1 to ZP in each case.

A contrast measure or sequence of contrast measures is defined in step B4. It was found that different contrast measures are particularly suitable for different structures. Therefore, the selection of the contrast measures can for example be implemented automatically from a priori information, for example CAD data of the wafer to be measured. Additionally, a plurality of filter operations can be selected as a contrast measure.

In a first example, a spectral process, in which the signal spectrum (FFT) is used, is used as a contrast measure. In this case, the extent of the spectrum in the Fourier space or in the spatial frequency space is evaluated. By way of example, the spectrum is compared to the spectrum of an edge. The spectrum of an edge is a 1/f line in the spatial frequency space (with frequencies f) transverse to the edge. In an example, the relative position of an edge is known and a contrast measure is determined by way of a one-dimensional Fourier transform perpendicular to the edge. In an example, the normalized sum over the high spatial frequency components is formed. The higher the result, the greater the contrast measure.

The image contrast itself is determined in a second example. To this end, 2-D image information from an image section is initially low-pass filtered or smoothed, for example. Then, the ratios of two intensity values of pixels at a respectively predefined spacing are formed, wherein the predefined spacing is adapted to structure size of the object. The normalized maximum of the ratios supplies the contrast measure. A contrast measure is determined in a similar method with the aid of a sequence of high-pass and low-pass filtering. In the two image directions, 2-D image information from an image section is respectively subjected to low-pass filter filtering in one direction and subjected to high-pass filtering in the same direction thereafter. The maximum values of both filtered images are summed and normalized. The higher the result, the greater the contrast measure.

In a third example, a histogram method with a grayscale value distribution is used as contrast measure. To this end, a histogram is created from the grayscale value distribution of each of the selected image sections. In the ideal setting plane, a histogram at a sharp edge includes two spaced apart accumulation points at two different grayscale values. By way of example, the ratio of the sum of the histogram values at the accumulation points to the overall sum of the histogram values is set and normalized. The higher the result, the greater the contrast measure.

In a fourth example, an edge filter is used as a contrast measure. This can be implemented by morphological operations which, for example, compare pixel values of adjacent pixels. In an example, the differences of each pair of two adjacent pixel values are compared to a threshold. For as long as a difference to an adjacent pixel value remains below the threshold, the pixel values are set to zero. The normalized sum over all determined pixel values is determined and the result corresponds to the contrast measure.

In a fifth example, a gradient method is used as a contrast measure. A scalar value of a local gradient is determined over all pixels; by way of example, the differences of the two adjacent pixels are formed in two directions and the scalar local gradient is determined therefrom by vector addition. The contrast measure can be formed either from the normalized sum of all scalar gradients or the normalized maximum value of the local gradients.

In a sixth example, a method of so-called relative distribution is used. In this case, a first derivative D1 of the digital image data from a selected image section is formed in a first step. Then, the digital image data of the selected image section are convolved with a point spread function and a second derivative D2 of the convolved digital image data is calculated. From the ratio of the two derivatives D1/D2 it is possible to ascertain how far the z-position of a selected image section is away from an optimal setting plane. The smaller the ratio D1/D2, the smaller the contrast difference and the further away the image recording was taken from an optimal focal plane.

In a method according the first embodiment, step B therefore further includes defining a method for determining a contrast measure, including at least one of the following methods: a spectral process, an image contrast, a histogram process, an edge filter, a method of relative distribution, or a gradient process. In addition to the aforementioned contrast measures, further contrast measures and variations of the above-described contrast measures are however also possible in equivalent manner. In order to attain a higher accuracy it is also possible to use a plurality of contrast measures. This can be desirable, for example, if a noise figure is above a certain threshold or a large focal deviation is present.

Two aspects are considered when selecting the parameters in steps B1 to B4: speed and accuracy. The method of determining the best focal plane is as quick as possible if only a few primary beams or only a few image sections are selected, for example fewer than R, where R is the number of image capture devices of the data acquisition device 280 arranged in parallel.

Otherwise, the method of determining the best focal plane is as accurate as possible if field curvature and, in particular, the image field tilt are also considered when selecting the selected image sections. The control unit 10 can define a control variable in step K depending on the status of the multi-beam particle microscope 1, which influences the selection of the parameters for steps B1 to B4. A priori information such as CAD information, for example, can also be provided by way of the control unit. Other information can also be recorded and taken into account by way of the control unit, for example the information from a z-height sensor. From different state observations of the multi-beam particle microscope 1 in step K the control unit can predict a focal change to be expected. In the case of a predicted small change a fast method for determining the best focal plane can be implemented, for example with only one selected image section. In the case of a predicted large change an accurate method for determining the best focal plane can be implemented, for example with five selected image sections and three adjacent z-positions. In the case of a predicted and undetermined change, there can be an accurate method for determining the best focal plane together with an iterative method with initially a very large increment in the z-direction.

Steps B1 to B4 need not be implemented in a certain sequence but can be implemented in any sequence or else in parallel. The steps may also depend on one another. By way of example, if the pixel size is chosen to be too large in step B2, the distribution of the grayscale values is averaged out, for example, and the spectrum or the histogram becomes more narrowband and a determination of the contrast measures becomes poorer; if the pixel size is chosen to be too small, there are for example only very low frequencies or a high noise component in the signal spectrum. Therefore, the determination of the pixel size in step B2 may depend on a plurality of parameters, for example on the structure size in the selected image sections, on the sample contrast, and on the predefined method for determining the contrast measures in step B4. In an example, the pixel size or the extent of the pixel sections can be chosen adaptively, that is to say different pixel sizes can be chosen for different z-positions; by way of example, the pixel size can be reduced with a decreasing z-distance from a suspected ideal focal plane.

In step C, the contrast measures in a z-position are determined for the L selected image sections. In the method according the first embodiment, step C therefore includes the following elements:

acquiring L digital image data of the L selected image sections 37 within the L selected sub-fields 31 using the detector system 200 in accordance with the parameters defined in step B;

evaluating the L selected image sections 39.1 to 39.L and determining L contrast measures Kl(i), ..., KL(i) with the data acquisition device 280;

transmitting the L contrast measures K1(i) to KL(i) to a control unit 10 and storing the L contrast measures K1(i) to KL(i).

In a step C1, L digital image data of the plurality of L selected image sections are recorded. To this end, a control signal is provided for the control unit of the beam deflection system 500, the control signal containing parameters describing the image section, for example start position, pixel size and end position of the image section. With respectively one of the J primary beams 3, the associated image section is traversed in each of the assigned sub-fields 31 and the digital data are acquired for the plurality of only L selected image sections. To determine the best setting plane, the image capture within an image field is converted to smaller image sections with only 256×256 pixels, for example.

The image data of the L selected image sections are evaluated in step C2 and a first contrast measure Kl(zl) with l=1 to L is determined for each l-th image section. The contrast measures are transmitted to a control unit 10 and temporarily stored there.

Different contrast measures, which increase the accuracy of the contrast determination, can be determined in an example. As a result, the method becomes particularly robust against errors or noise.

A check as to whether a predefined minimum number of contrast measures has already been measured is carried out in step E. If this is not the case, for example if less than three contrast measures have been measured for each selected image section, the method continues with step D.

In step D, the position of the first plane 101 is changed in the z-direction and displaced into a z-position z2 in relation to the first plane 101 with z-position z1. In this case, the change is implemented in the first step by the first distance change dz1.

Steps C1 and C2 are subsequently repeated, and second or further contrast measures Kl(z2) are determined. Then, there is for example a further repetition of step D with a second or further distance change dz2 and third or further contrast measures Kl(z3) are determined in a repetition of steps C1 and C2. The respective change in the Z-positions in the repeated steps D in this case correspond to the increments dz1, dz2, ..., dzP of the focusing series defined in step B3.

The contrast measures are checked in step E, and steps D, C1 and C2 are repeated until a sufficient number of contrast measures has been determined at a sufficient number P of different z-positions for each selected image section. In an example, the contrast measures themselves are also checked, in addition to the number of z-positions, during the check. By way of example, the contrast measures are checked here in relation to a threshold. All contrast measures are too low in a first example. In this case, a new z-position for new focusing series is determined from the contrast measures and set by way of step D, and the focusing series is repeated starting with step C. In a second example, at least one contrast measure for selected image section is too small. In this example, a new image section is chosen in a repeated step B and the measurement is repeated.

In an example, the contrast measures are compared to one another. If the contrast values have a difference that is too small, for example less than 10%, or if the contrast values have a difference that is too large, for example more than 70%, the method continues with step D. In an example, use is made here of the changes to the setting plane that were predefined in step B. Alternatively, the pitch change dz for a further setting plane, which distance change is involved for a further determination of a further contrast measure, can also be determined in step E. By way of example, if the contrast values have a difference that is too small, of for example less than 10%, it is possible to determine a larger increment dz in a z-direction. By way of example, if the contrast values have a difference that is too large, of for example more than 70%, it is possible to determine a further z-position for a further contrast measurement between two z-positions of two already measured contrast measures.

In an example, the noise figure of the contrast measures is considered for the thresholds or for the desired maximum or minimum differences between the contrast measures. Here, the noise figure of the determination of the contrast measures depends on the dwell time of each primary beam on a pixel, on the pixel size, and on the sample contrast. In this case, the sample contrast is defined by the ratio of the yield of secondary electrons at different sample structures. In the case of a relatively large noise figure, the measurement is repeated starting with step B, for example, and a longer dwell time or greater number of contrast measures at a greater number of z-positions is defined in the step B.

In a method according the first embodiment, step E therefore further includes a check as whether each of the determined contrast measures meets a criterion and, if the criterion is not met, at least one further z-position z(P+1) is determined, followed by a repetition of step D with a displacement of the first setting plane 101 into the further z-position z(P+1) and by a repetition of step C at the further z-position z(P+1) for the purposes of determining further contrast measures K1 to KL(P+1).

In step F, the contrast measures are evaluated for each selected image section. The contrast measures for a selected image section as function of the focus yield parabolas or hyperbolas, each with an apex, and a parabolic or hyperbolic curve of the contrast measures of the different selected image sections over the z-position is approximated from at least three contrast measures at different z-positions and a maximum z-position of the parabolic or hyperbolic curve is determined. For each selected l-th primary beam, a best focal position zl with a minimum beam waist 74 of a primary beam is obtained (cf. FIG. 4).

By way of example, a square dependence or a parabolic curve of the contrast measure over the z-coordinate is determined for the contrast measures Kl(i=1), . . . , Kl(i=5) for an l-th primary beam or the l-th selected image section. Consequently, by determining the maximum of the contrast measure it is possible to determine an ideal focal position zl for each l-th primary beam. For each primary beam, the ideal focal positions zl in each case correspond to the plane 68 corresponding to the minimum beam cross section 74 in FIG. 4. In this way, the respective best focal position z1, z2, . . . , zL is determined for the L selected primary beams.

Calculating the ideal focal positions zl for each selected primary beam can lead to a termination and restart of the process. By way of example, an ideal focal position can be too far away from the first plane 101, and so as an approximation a linear curve of the contrast measures is determined instead of a parabolic curve. Then, a new first setting plane 101 is calculated from the linear profile and the method is restarted beginning with step C from this new first setting plane 101.

In a further example, the parabolic curves of the contrast measures for selected primary beams can differ too much from one another. This can indicate aberrations such as an astigmatism and an auto-stigmation is started, within the scope of which the multi-beam particle microscope 1 is recalibrated according to the conventional methods. A method for determining aberrations can be for example a modified method according the first embodiment, for example a method according the seventh embodiment of the present disclosure. Further methods for auto-stigmation are known to the person skilled in the art. After calibration and correction of aberrations such as for example astigmatism or spherical aberration, the method for determining an optimal setting plane is restarted with step C.

In an example, step F runs parallel to step E. A focus model is created from the available contrast measures after each setting of a new focal plane in step D and determination of the contrast measures in step C. When determining the focus model, an optimal focal position for each selected image section, and additionally a quality measure of the focus calculation, are determined from the previous measurements of the contrast measures, for example by way of a parabolic fit. By way of example, the quality measure can be determined by a noise figure and can in principle describe the accuracy of the determination of the optimal focal position for each selected image section. The loop including steps C and D is repeated until a sufficient quality measure has been reached. As soon as the quality measure is better than a predefined value, the loop including steps C and D can be terminated and the optimal focal plane can be calculated in the subsequent step G.

The best or optimal focal plane is determined in step G. The optimal focal plane for the plurality of the primary beams is determined from the best setting positions of the selected image sections 39 of the associated selected primary beams. The focal profile of five primary beams along a y-axis is illustrated using a simplified example in FIG. 7A. In this case, the focal positions 74.1 to 74.5 of the five primary beam profiles 62.1 to 62.5 are located approximately on a sphere with radius R, the center 43 of which is spaced apart from the z-axis in accordance with an image plane tilt 45. The y-axis 41 corresponds to the position of the best focal plane slightly above the focal position 74.3 of the axial primary beam 62.3. The focal positions 74.1 to 74.5 are located between a maximum z-position or upper focal plane 47 and a minimum z-position or lower focal plane 49 and have a z-extent or an interval 51. According to the method according to the disclosure for determining an optimal setting plane, different methods are possible for determining the optimal setting plane in step G. At this point, it is worth to mention the fact that the wafer cannot simply be arranged tilted parallel to a plane 45 since the primary beams in this case would no longer strike the wafer in perpendicular fashion. By way of example, the angle of incidence of the primary beams may not deviate by more than 10 mrad from the perpendicular of a wafer surface.

Figure 7A:
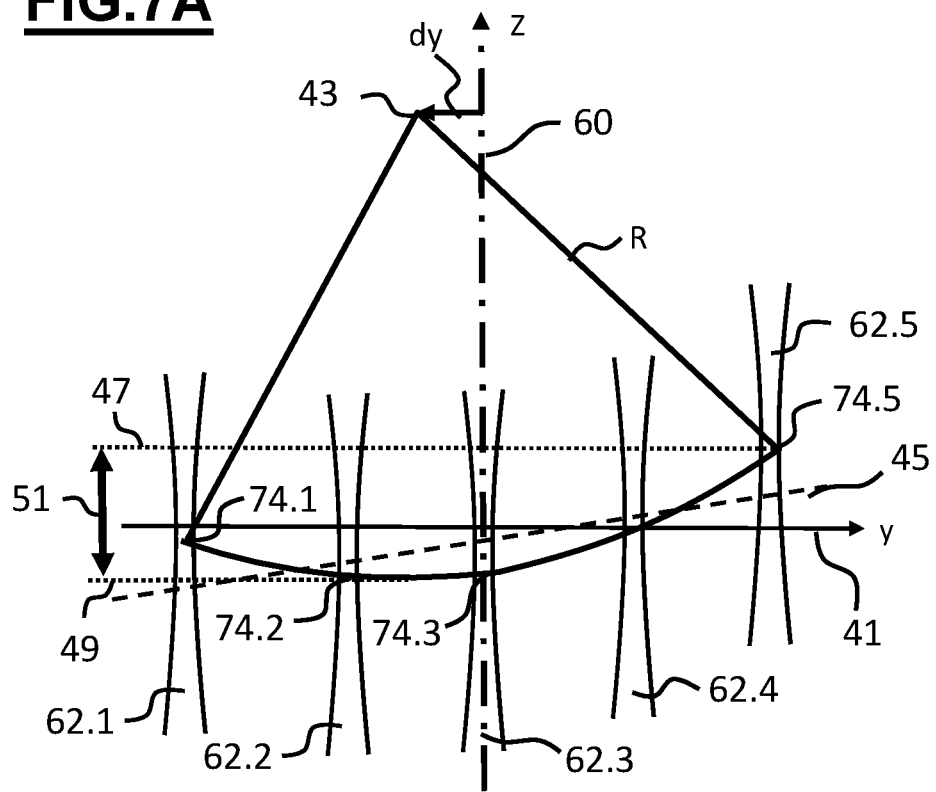
FIGS. 7A-7B show the result of determining and setting an optimal focal plane according to a first example.

In a first example, the optimal setting plane is determined by way of the primary beams assigned to the selected image sections. By way of the selection of the selected image sections and assigned primary beams described in step B it is possible to ascertain a curved image surface and an image plane tilt. Both curved image surface error and an image plane tilt can be taken into account when determining the optimal setting plane 41, as illustrated in FIG. 7A, wherein the focal positions of the plurality of the primary beams come to rest on a curved image surface with radius R, wherein the center of the curved image surface 43 is offset from the z-axis by the absolute value dy. The image plane tilt is taken into account by way of this offset.

In a second example, the focal positions of further primary beams, or even of all primary beams, are calculated in accordance with a model in an optional step G1 from the focal positions z1, z2, ..., zL of the primary beams assigned to the L selected image sections. In this case, the model considers both curved image surface and image plane tilt and is formed for example by a predefined focal profile for each of the J primary beams, as illustrated in FIG. 4 for one primary beam, wherein the focal positions of the plurality of the J primary beams come to rest on a curved image surface with radius R, wherein the center of the curved image surface 43 is offset from the z-axis by the absolute value dy. The image plane tilt is taken into account by way of this offset.

The model can be based on further model parameters. By way of example, the upper and lower admissible focal deviations can be calculated for each primary beam from a desired resolution and can be taken into account in the model. The upper and lower admissible focal deviations may also differ on account of aberrations for different primary beams.

Then, an optimal setting plane 41 is calculated in step G1 from the determined focal positions z1, z2, ..., zL of the selected primary beams or from all focal positions of all primary beams determined in step L. Various methods are possible to this end:

The interval 51 between an upper focal plane 47 and a lower focal plane 49 is halved.

A mean value is formed over all z-positions.

A value is chosen at which the worst resolution of a primary beam becomes minimal ("disk of least confusion").

Figure 7B:
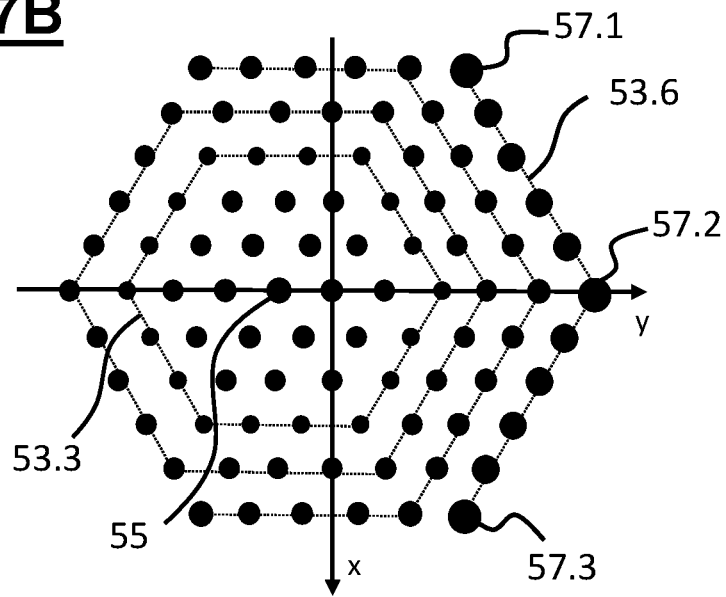

A setting plane is determined which is located between the upper and lower admissible focal deviations of as many primary beams as possible such that the resolution target is attained for as many primary beams as possible (see FIG. 7B).

All methods allow for individual primary beams to optionally not meet the resolution target. The primary beams that do not meet a predefined resolution target are determined in optional step G2 and are transmitted to the control center 10 via control step K. The transmitted primary beams may optionally be excluded from a wafer inspection task or the digital image data of the assigned sub-fields acquired using these primary beams can be labeled and for example provided with a worse quality measure.

Finally, in step H, the upper side of the wafer is displaced into the optimal focal plane 41 determined in step G. In the case of small deviations of the best focal plane from the first plane 101, the adjustment can be implemented using the objective lens system 100. The adjustment can be implemented using the displacement stage 600 in the case of relatively large deviations. Further, the sample potential 605 can be changed for the purposes of changing the focal plane of the plurality of the primary beams 3. Subsequently, the best focal position 41 is stored as new first plane 101 such that the latter corresponds to the optimal focal plane determined in accordance with step G.

To obtain a higher accuracy, the method with steps B to H can be carried out multiple times in succession, with the parameters for the focusing series being able to be changed or altered in step B.

FIG. 7B elucidates the result of the method according the first embodiment. In this example, the plurality of the primary beams 3 has a hexagonal grid arrangement. The point of intersection of the x-axis and the y-axis corresponds to the optical axis or z-axis 60. The circles respectively describe the beam cross sections 5 of each primary beam through the optimal focal plane 41, as determined according to the method described above. Reference sign 55 denotes the primary beam whose focal point z determines the lower focal plane 49. The optimal setting plane is situated above the lower focal plane 49, and so the beam cross section of the primary beam with reference sign 55 is not minimal. Around the primary beam with the reference sign 55, primary beams are arranged in virtual concentric rings 53, only a few of which are plotted for illustrative purposes, for example ring 53.3 and a segment of ring 53.6. The primary beams which on the virtual concentric ring 53.3 have their minimum beam cross sections closest to the optimal setting plane 41. The primary beams, which on the segment of the virtually concentric ring 53.6 have their minimum beam cross sections furthest away from the optimal setting plane 41 and the beam cross sections in the optimal setting plane 41 have the largest diameter. In this example the optimal setting plane 41 is formed such that a resolution target is achieved for as many primary beams as possible. However, the beam cross section exceeds the resolution limit for three primary beams 57.1, 57.2, 57.3 which have the greatest distance from the beam 55. These beams are marked in step F3 and considered separately in the evaluation by the control unit 10. By way of example, from the first plurality of J1 primary beams, only a smaller, second plurality of J2 primary beams are then used for the inspection task in this example, where J2<=J1.

In an example, the first setting plane 101 in step D is changed by changing the excitation of at least one electromagnetic element, for example the objective lens system 102. On account of the hysteresis of a magneto-dynamic objective lens 102, the change in distance of the focusing series is ideally only carried out only in one z-direction therewith. To this end, it is advantageous if the first z-position of the focusing series starts above the expected ideal focal plane and is continued in the negative direction of the Z-axis (see FIG. 2) in this case. In a further example, the change is implemented by changing the sample voltage or the sample potential 605 (see FIG. 2). A change in the sample voltage 605 brings about a change in the focal plane of the plurality of the primary beams 3. By way of example, if the sample voltage 605 is increased, the primary elections are decelerated in more pronounced fashion and the focal plane 68 of a primary beam 3 changes in the direction of the objective lens system 102 (in the positive z-direction in FIG. 2).

Alternatively, the change in the first setting plane 101 in step D is implemented by changing the position of the surface 15 of the object 7 using the displacement stage 600. However, it is also possible for the change in the first setting plane 101 in step D to be implemented simultaneously by a change in the actuation of an objective lens 102, by a change in the position of the surface 15 of the object 7 using the displacement stage 600, or by a change in the sample voltage 605.

As explained in the sixth embodiment, the change in the actuation of an objective lens 102 can include changing two actuation signals such that the sum of a first and a second current remains constant and the difference of the first and the second current is changed. In this way, an optimal focal plane 41 or first setting plane 101 can be set particularly accurately and can be kept stable via the objective lens 102.

In a method according the first embodiment, step D therefore further includes the displacement of the first setting plane 101 by changing the actuation of an objective lens 102 or by changing the z-position of the surface 15 of the object 7 by way of the displacement stage 600 or by changing a sample voltage 605 or by a combination of at least two of the aforementioned changes. In an example, the change in the actuation of an objective lens 102 includes changing two actuation signals such that the sum of the squares of a first and a second current remains constant and the difference of the squares of the first and the second current is changed.

As explained in the fifth embodiment, an actuation signal for a compensator for an image plane tilt is determined from the image plane tilt determined in step F in an example and is fed to a compensator for an image plane tilt. A compensator for an image plane tilt according the fifth embodiment is arranged in the multi-beam generation device 305.

In an example, an actuation signal for a compensator for a curved image surface error is determined from the curved image surface error determined in step F and is fed to a compensator for a curved image surface error. As explained in more detail below, an image plane in a multi-beam particle microscope 1 with a beam divider 400 experiences an image plane tilt 45, for example about a tilt axis, as for example the x-axis in FIG. 7A, which can be twisted about a z-axis by the objective lens 102. In addition to determining the image plane tilt 45 by the absolute value of the tilt angle about the tilt axis, the orientation of the tilt which arises from the image rotation by the objective lens is additionally determined in step F. In an example, the objective lens 102 is operated with virtually constant parameters such that the image rotation of the objective lens 102 can be determined in advance and can be taken into account in the system design.

As explained in the third embodiment, a displacement vector is determined in step G in an example, the displacement vector describing the desired offset for the grid arrangement of the primary beams in order to increase the number of the plurality of J primary beams 3 which meet a resolution criterion. By way of example, the displacement vector can be determined from the primary beam with reference sign 55, in relation to which the focal profile of the other primary beams is arranged virtually concentrically. A control signal for a first deflector can be determined from the displacement vector, the first deflector being designed to offset the grid arrangement of the primary beams 3 by the displacement vector when in operation. What this can achieve is an increase in the number J1 of primary beams by which an image generation can be achieved while meeting the desired relation to the resolution. In some cases, it is possible to meet a focal diameter of for example below 4 nm or below 3 nm with all of the J primary beams.

A second embodiment of the disclosure relates to a multi-beam particle microscope 1 which is configured to set an ideal focal plane for a best resolution with a plurality of J primary beams over an image field. FIG. 2 shows details of the multi-beam particle microscope 1. The multi-beam particle microscope 1 includes a controller system 10, which communicates with a data acquisition device 280. The data acquisition device 280 is designed for operation in a first and in a second mode of operation. The data acquisition device 280 is configured to be able to be switched from the first to the second mode of operation. The controller system 10 further communicates with a displacement stage 600, an objective lens 102 and a sample holder of the displacement stage 600. The displacement stage 600 includes actuators and sensors, and is configured to position a surface 15 of a wafer 7 in a first setting plane 101. The controller system 10 of the multi-beam particle microscope 1 is further connected to the scan deflector 500 for collective deflection of the plurality of primary beams 3.

The multi-beam particle microscope 1 of the second embodiment includes a first mode of operation, in which the multi-beam particle microscope 1 is configured to acquire digital image data of an object surface 15. In the first mode of operation, the beam deflector 500 is configured to scan the plurality J of the primary particle beams 3 over the plurality of the respectively assigned J sub-fields 31 and to acquire image data of an image field 17 using the particle multi-detector 209 and the data acquisition device 280. The data acquisition device 280 is configured, when in operation, to write the image data to a memory 290 in the first mode of operation. The control unit 10 is configured, when in operation, to read the image data from the memory 290 in the first mode of operation.

The controller system 10 is configured during the operation of the multi-beam particle microscope 1 to switch from a first mode of operation to a second mode of operation. During the second mode of operation, the scan deflector 500 is configured to scan the plurality of primary beams 3 over a plurality of image sections 37 within the plurality of sub-fields 31 (see FIG. 6). The data acquisition device 280 is configured to be switched to the second mode of operation. The particle multi-detector 209 is configured to receive image signals from the secondary electrons 9 during the second mode of operation and transmit these to the data acquisition device 280. During the second mode of operation, the data acquisition device 280 is configured to calculate a plurality of L contrast measures from the image signals for $L \leq J$ selected image sections 39 (see FIG. 6) and to transmit to the L contrast measures to the controller unit 10.

During the second mode of operation, the controller unit 10 is configured to ascertain an optimal setting plane for the surface 15 of the wafer 7 from the at least L contrast measures. The controller unit 10 is further connected to an objective lens 102 and is configured, when in operation, to drive the objective lens 102 with a control signal. In the second mode of operation, the control unit 10 is configured to determine a change in the control signal and to drive objective lens 102 with the changed control signal for the purposes of changing the position of the first plane 101. The controller system 10 is further connected to the displacement stage 600 and is configured to change the position of the surface 15 of the wafer 7 via the actuators of the displacement stage 600. The controller system 10 is further connected to the sample receiver of the displacement stage 600 and is configured to change a sample voltage.

By way of the parallel switching of the data acquisition device 280 and of the scan deflector 500 from a first into a second mode of operation, the multi-beam particle microscope 1 is configured either to perform an image recording in the first mode of operation or to determine an optimal setting plane in the second mode of operation. The measurement system for determining the optimal setting plane thus corresponds to the image recording system, which contains the detector 209 and data acquisition device 280. The detector 209 contains at least one detector for each of the J primary beams.

The data acquisition device 280 for example includes a plurality of processors, for example FPGAs, arranged in parallel, which can be switched from the first mode of operation and to a second mode of operation. Further details relating the data acquisition device are contained in WO 2021156198 A1, filed on Feb. 1, 2021, and in WO 2020151904 A2, filed on Jan. 14, 2020, the entirety of which is herewith incorporated by reference.

The plurality of processors arranged in parallel is configured in the second mode of operation to calculate a plurality of contrast measures in parallel and is configured in the first mode of operation to calculate address data of image data and to write the image data at the address data to the memory 290.

The actuation system of the multi-beam particle microscope 1 includes at least a displacement stage 600 and an objective lens 102. Additionally, further, fast additional lenses can be provided, for example as described in the German patent DE 102020125534 B3, filed on Sep. 30, 2020, the entirety of which is herewith incorporated in the disclosure. The z-positioning accuracy of the first setting plane 101 can be below 125 nm, for example below 100 nm or below 50 nm. Small changes of the setting plane 101 of less than 500 nm can be set by way of the objective lens 102.

The surface 15 of a wafer 7 is positioned in the first setting plane 101 of the multi-beam particle beam system 1 using the positioning device 600, wherein the z-position and an angle of the first setting plane 101 are determined in the second mode of operation according a method according to the first embodiment. Position and angle of the first setting plane 101 are stored in the controller unit 10 and the position of the substrate surface 15 is for example additionally monitored by way of sensors of the positioning device 600. Further sensors which measure the position of the surface 15 of the substrate or a wafer 7 in relation to a reference surface can also be arranged, for example interferometric sensors or confocal sensors which measure the distances between the surface 15 of the substrate or wafer 7 and a reference surface at a plurality of sites. A reference surface can be securely connected to the objective lens 102.

There is a switch into the second mode of operation whenever, for example, a new wafer 7 is loaded onto the displacement stage 600 for a new wafer inspection task or there has been a relatively long pause in the operation of the multi-beam particle microscope 1. In particular, a switch into the second mode of operation can also be implemented when a change in the thickness of an object or wafer 7 is expected, or if the surface 15 of an object 7 is expected to not be perfectly parallel to an object receiving area of the positioning device 600. A switch into the second mode of operation can also be implemented if the evaluation of the data from an inspection task yields a deviation between the first setting plane 101 of the object surface 15.

Figure 8:
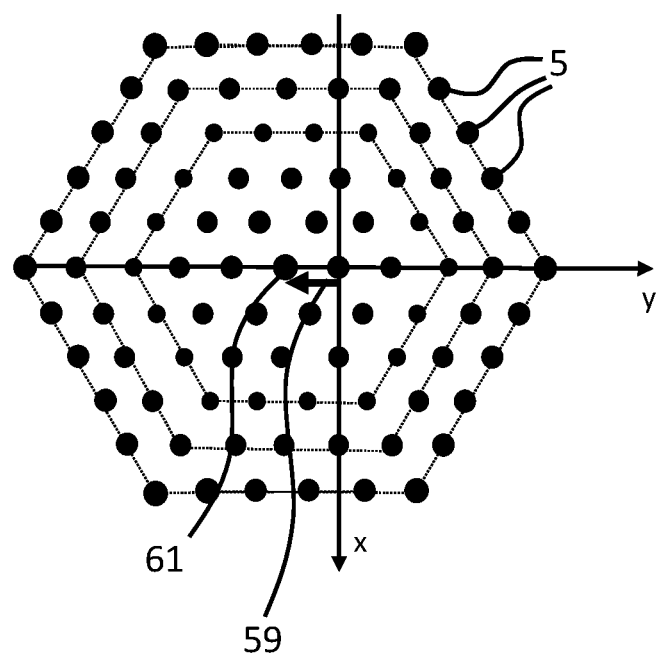
FIG. 8 shows the result of setting an optimal focal plane according to a second example, in which the plurality of the primary beams are laterally offset.

A further improvement in a resolution is achieved in a third embodiment of a multi-beam particle microscope 1 by way of an even more precise setting of an optimal setting plane. As explained above, a multi-beam particle microscope 1 includes a beam divider 400. An image plane tilt of a specified size of for example up to several 10 mrad, for example up to 50 mrad or more, arises due to the beam divider 400. Here, the image plane tilt usually depends on the changeable kinetic energy of the plurality of primary beams 3. In a third embodiment of a multi-beam particle microscope 1, the negative effect of the image plane tilt on the setting of an optimal focal plane and on the achievable resolution for the plurality of primary beams 3 is reduced. In an example, the improvement in the resolution is achieved by a targeted selection of the plurality of primary beams. A first example of the third embodiment is given by the above-described rejection of certain primary beams 57, for which a resolution criterion cannot be met such that the second plurality J2 of primary beams is smaller than the first plurality J, with J2<J. This first exemplary embodiment may not provide a resolution of for example below 5 nm, below 4 nm or even less. By contrast, an advantageous, second example is illustrated in FIG. 8. In relation to FIG. 7B, the grid arrangement of the plurality of primary beams 3 with focal points 5 in the first setting plane 101 is arranged offset by a displacement vector 59 in relation to an optical or z-axis (perpendicular axis through the point of intersection of the x- and y-axis) in FIG. 8. The focal point 61 of the center beam or central beam of the plurality of primary beams 3 is therefore located offset to the Z-axis which coincides with the axis of symmetry 105 of the objective lens 102 (see also FIG. 10). An image field tilt is compensated in conjunction with a field curvature by way of this offset 59. By way of example, the offset 59 can be achieved by way of an offset of the generation device 300 or of the multi-aperture arrangement 305 for the generation of the plurality of primary beams 3. In another example, the multi-beam particle microscope 1 includes at least one deflector 701 which is arranged between the generation device 300 and the beam divider 400 and which can be used to laterally offset the grid arrangement of the plurality of primary beams. To this end, the first deflector 701 can be distant from an intermediate image plane (see FIG. 10). The offset 59 can be set or be changed on the basis of the kinetic energy of the primary beams 3, for example by way of actuators for the lateral displacement of the multi-aperture arrangement 305 or by way of static deflection using the first deflector 701. In this embodiment, the center 21 of an image field 17 no longer coincides with the axis of symmetry of the objective lens 105. This deviation can be considered in the control system 10 when positioning the wafer 7 for an inspection task.

Therefore, the third embodiment is described by a multi-beam particle microscope 1 including
a. a multi-beam generation device 300 for generating a plurality of J primary beams 3 in a grid arrangement,
b. a beam divider 400 and
c. an objective lens 102 with an axis of symmetry 105 of the objective lens 102, wherein the intersection points 5 of the grid arrangement of the plurality of J primary beams 3 in a first setting plane 101 are offset by a displacement vector 59 in relation to the axis of symmetry 105.

In an example, the multi-beam generation device 300 contains at least one multi-aperture plate 306 with a plurality of openings for generating the plurality of J primary beams 3, wherein the at least one multi-aperture plate 306 is arranged laterally offset.

In an example, the multi-beam particle microscope 1 includes at least one first variable deflector which 701, when in operation, is configured to collectively laterally offset the plurality of J primary beams 3 in the first setting plane 101 by the displacement vector 59.

A tilt of the displacement stage 600 is set in a fourth embodiment in order to compensate an image plane tilt. In this embodiment the displacement stage 600 contains a tilt device 610 for the displacement stage 600. By way of example, compensators for correcting a curved image surface error are additional electrostatic elements which are provided in the generation device 300 and which can account for a curved image surface error. Then, a dominant portion of an image plane tilt remains as imaging aberration.

Figure 9:
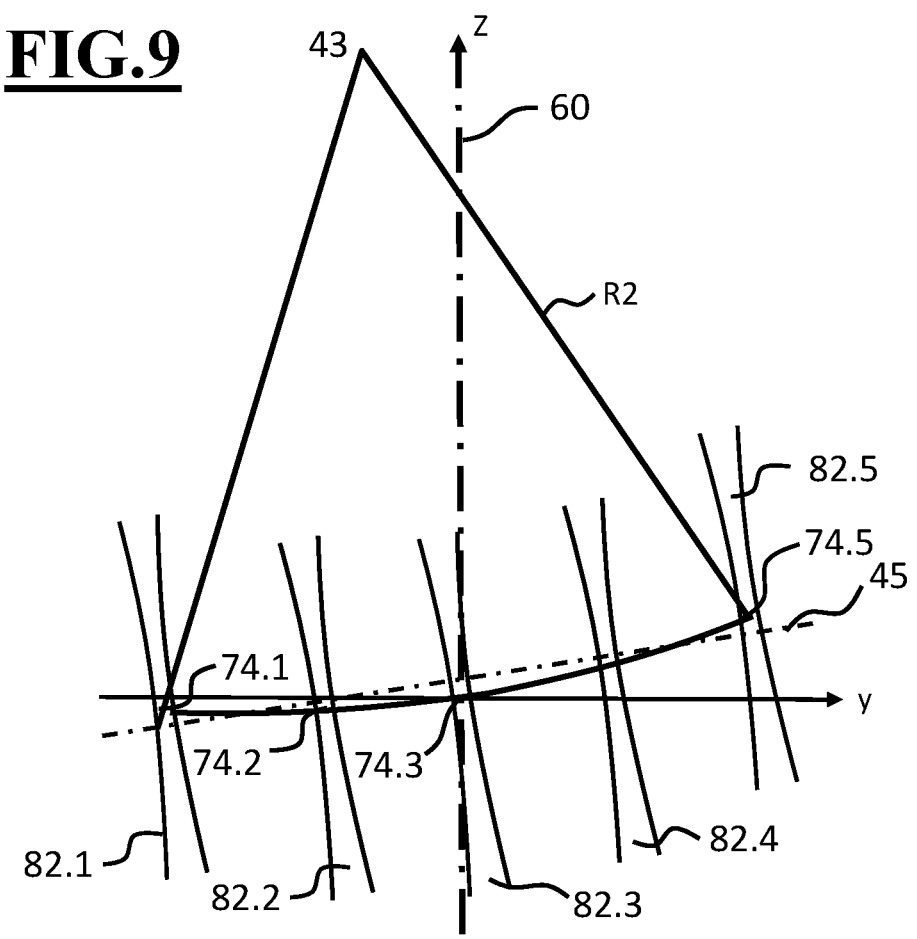
FIG. 9 shows the result of setting an optimal focal plane according to a third example, in which an image plane is tilted.

An image plane tilt can be compensated for by a tilt of the displacement stage 600. However, purely tilting the displacement stage 600 leads to the plurality of primary beams 3 no longer being incident on the surface 15 of the wafer 7 in perpendicular fashion, but being incident at an angle, as explained above. To compensate the tilted angle of incidence of the plurality of the primary beams 3, at least one second, static deflector 703 is therefore arranged in the multi-beam particle microscope 1 between the generation device 300 and the beam divider 400 (see FIG. 10), the second, static deflector 703 bringing about a deflection of the plurality of the primary beams 3 and hence changing an angle of incidence of the plurality of the primary beams 3 on a sample surface 15. The second static deflector 703 can be in the vicinity of an intermediate image plane 325 of the primary beams 3. FIG. 9 illustrates the result of the fourth embodiment using a similar example as in FIG. 7A with similar reference signs as in FIG. 7A. In comparison with FIG. 7A, a curved image surface error is at least partly compensated, schematically illustrated by way of a larger radius R2. Ideally, a curved image surface error is completely compensated and R2 becomes very large, for example infinite. The surface 15 of the wafer 7 can now be arranged in the tilted image plane 45 and the plurality of the primary beams 82.1 to 82.5 are tilted with respect to the z-axis by way of the second deflector 703 such that they intersect the tilted image plane 45 in perpendicular fashion. The fourth embodiment is advantageous, in particular, when the curved image surface error is compensated by other compensators.

The fourth embodiment corresponds to a multi-beam particle microscope 1 including a multi-beam generation device 305, a beam divider 400 and an objective lens 102 with an axis of symmetry 105 of the objective lens 102, and a positioning device 600 for positioning an object 7, wherein the positioning device 600 includes a tilt device 610 and the multi-beam particle microscope 1 further includes a second deflector 703 in the vicinity of an intermediate image plane 325 of a plurality of J primary beams 3, the second deflector being configured, when in operation, to change an angle of incidence of the plurality of the J primary beams 3 on a surface 15 of an object 7 situated on the positioning device 600 such that the angle of incidence of the plurality of the primary beams 3 is perpendicular or 90° when tilting the positioning device 600 using the tilt device 610.

According to the fourth embodiment, the control unit 10 is further connected to the stage 600 and, together with the stage or positioning device 600, brings about a tilt of the wafer surface 15 by way of the tilt apparatus 610 in order to compensate an image field tilt. The control unit 10 is further connected to the second static deflector 703 by way of the control unit 700, the second static deflector being arranged in the vicinity of the intermediate image surface 321, for example. The second static deflector 703 is configured, when in operation, to deflect the plurality of the first primary beams 3 collectively in a direction to help ensure a perpendicular incidence of the primary beams 3 on the tilted wafer surface 15.

Figure 10:
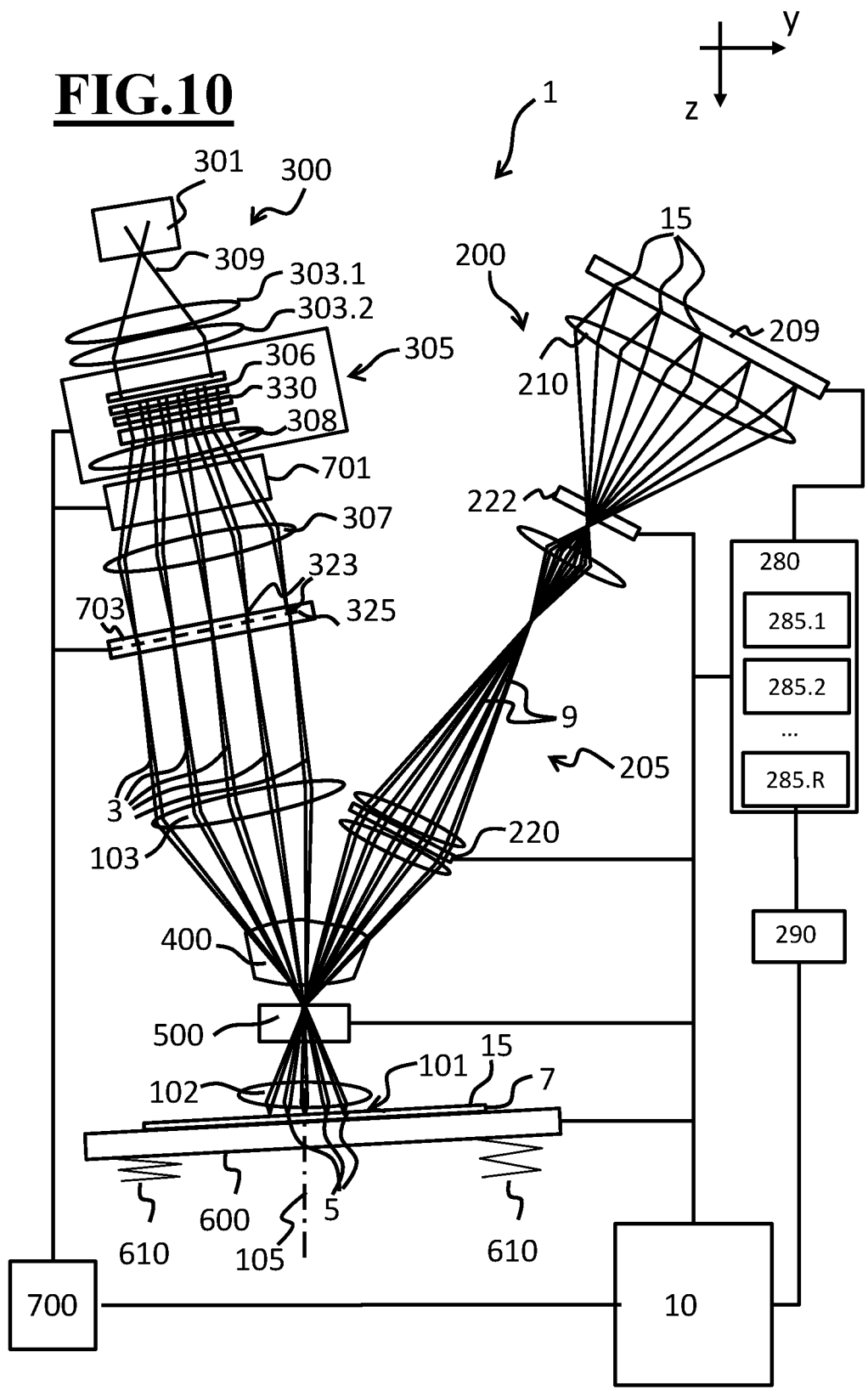
FIG. 10 shows a schematic illustration of an embodiment of a multi-beam particle microscope.

FIG. 10 shows further aspects of a multi-beam particle beam system 1 according to the embodiments. The multi-beam particle beam system 1 includes a beam generation apparatus 300 with a particle source 301, for example an electron source. A divergent particle beam is collimated by sequence of condenser lenses 303.1 and 303.2, and strikes a multi-aperture arrangement 305. The multi-aperture arrangement 305 includes a plurality of multi-aperture plates 306 and a field lens 308. The multi-aperture arrangement 305 is followed by further field lens 307. The multi-aperture arrangement 305 and the field lens 307 are configured to generate a plurality of focal points 323 of primary beams in a grid arrangement on a surface 325. The surface 325 need not be a plane but can be a spherically curved surface in order to account for a field curvature of the subsequent particle-optical system. A first static deflector 701 is arranged between the multi-aperture arrangement 305 and the field lens 307, the first static deflector being configured to laterally displace the grid arrangement of the beam foci 311 on the surface 325 in the y-direction and hence bring about a displacement 59 in the first setting plane 101. Consequently, the effect of an image plane tilt can be at least partly compensated in accordance with the third embodiment. However, the compensation of the image plane tilt according the third embodiment is only possible if the curved image surface error has not been completely compensated and an image plane tilt can be compensated in combination with a curved image surface error. The multi-beam generation device 305 of the multi-beam particle microscope 1 according FIG. 10 further includes a compensator 330 for an image plane tilt according the fifth embodiment, which is described in more detail below.

The multi-beam particle beam system 1 further includes a system of electromagnetic lenses 103 and an objective lens 102, which image the beam foci 323 with reduced size from the intermediate image surface 325 into the first setting plane 101. In between, the primary beamlets 3 pass through the beam divider 400 and the collective beam deflection system 500, by which the plurality of the primary beams 3 are deflected when in operation and the image field 17 is scanned. The first plane 101 is an optimal focal plane determined according the first embodiment. The surface 15 of a wafer 7 is positioned in the first plane 101 using the displacement stage 600. A plurality of secondary beams 9 arise at the focal points 5 as a result of irradiation by the plurality of primary electron beams 3, the secondary beams being captured by the objective lens 102 and being fed to the projection system 200 by way of the beam divider 400. The projection system includes an imaging system 205 with first and second lenses 210 and 220, a second collective scan deflector 222 and a multi-particle detector 209. The multi-particle detector 209 is connected to the data acquisition device 280 which is connected to the control unit 10, either directly or via a memory 290. The control unit 10 is further connected to controller unit 700 which drives the first electrostatic deflector 701 and the second static deflector 703 and the compensator 330 for an image plane tilt.

A multi-beam particle microscope 1 according FIG. 10 includes a control unit 10, a data acquisition device 280, an image data memory 290 and a scan deflector 500, wherein the control unit 10 and the data acquisition device 280 are configured such that they can be operated in a first mode of operation or in a second mode of operation. In the first mode of operation, the control unit 10, the scan deflector 500 and the data acquisition device 280 are configured to ascertain a contiguous digital image of an object surface 15 arranged in an image field 17 of the multi-beam particle microscope 1 and to store the image in the image data memory 290. In the second mode of operation, the control unit 10, the scan deflector 500 and the data acquisition device 280 are configured to acquire and evaluate selected digital image data of an object surface 15 arranged in an image field 17 of the multi-beam particle microscope 1. In an example, the control unit 10, the scan deflector 500 and the data acquisition device 280 are configured in the second mode of operation to carry out a method according the first or seventh embodiment.

A multi-beam particle microscope 1 according FIG. 10 further includes an actuation system which at least includes a displacement stage 600 or an objective lens 102. A multi-beam particle microscope 1 according FIG. 10 further includes a multi-beam generation device 305 with a compensator for an image plane tilt 330. A multi-beam particle microscope 1 according FIG. 10 further includes a compensator for a tilt of the primary beams 703 and a tilt device 610 for the displacement stage 600 according the fourth embodiment. In a multi-beam particle microscope 1 according FIG. 10, the data acquisition device 280 contains a plurality of R image digitizers 285.1 to 285.R connected in parallel, wherein the image digitizers 285.1 to 285.R are configured in the first mode of operation to acquire image data from J sub-fields 17 and to store the image data in a digital image data memory 290, and are configured in a second mode of operation to acquire image data of L=R selected sections and to calculate L=R contrast measures from the image data of the L=R selected sections and to transmit these contrast measures to the control unit or to store these contrast measures in the digital image data memory 290. In a multi-beam particle microscope 1 according FIG. 10, the control unit 10 is further configured to calculate L=R best focal planes of L=R selected primary beams from the stored contrast measures and to calculate an image plane tilt therefrom.

In a fifth embodiment a compensator 330 is described in more detail, the compensator facilitating an even better setting of an optimal focal plane and facilitating an even better resolution of below 5 nm (e.g., below 4 nm, below 3 nm) over an even greater plurality J of primary beams 3. Both in the third and in the fourth embodiment, the number J of the plurality of the primary beams 3 is limited by the asymmetric selection of primary beams or by the global tilt of the primary beams 3. The loss of resolution as a result of a curved image surface error reduces approximately quadratically, and so a focal plane setting of a planar focal plane with a planar wafer surface 15 limits the maximum possible number J2 of primary beams with a resolution below 5 nm, below 4 nm or below 3 nm to less than J2<90 beams, for example. An improved focal plane setting and improved resolution with resolutions of below 4 nm or below 3 nm for a large plurality of J2 primary beams with J2>90 is facilitated by the fifth embodiment of the disclosure. With the fifth embodiment, an image plane tilt is accounted for.

Figure 11:
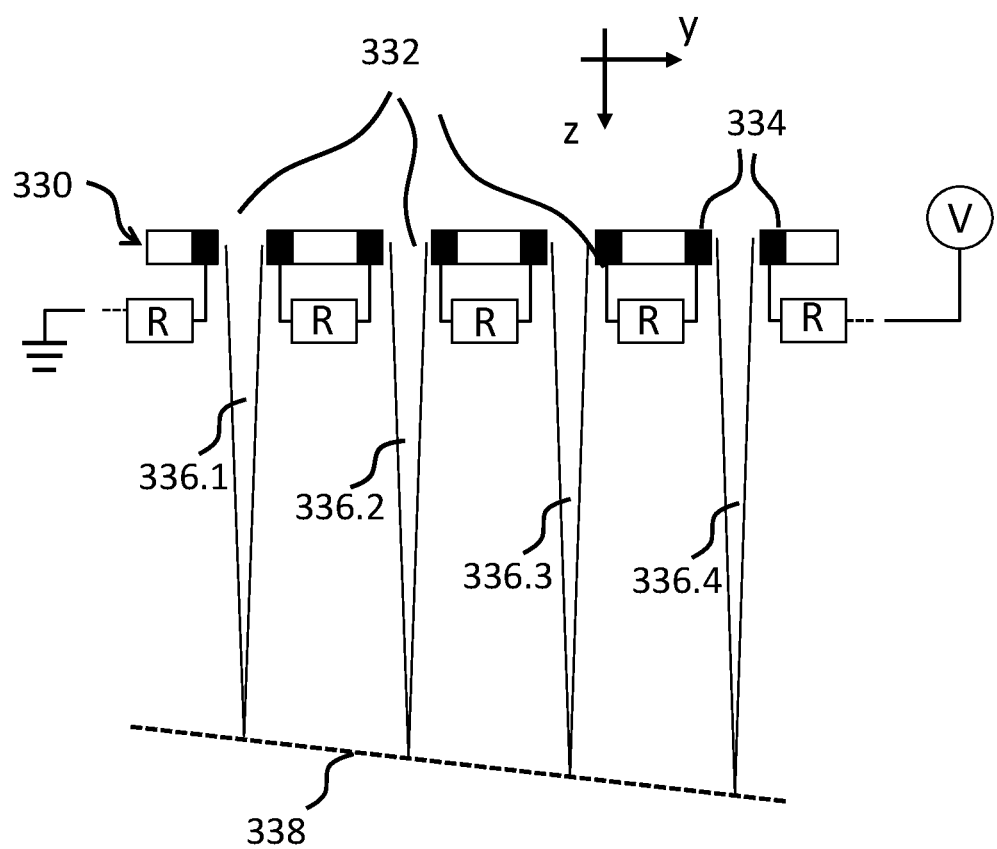
FIG. 11 shows a section through a compensator for keeping available an image plane tilt.

The prior art mentions a plurality of compensators for a curved image surface. By way of example, by way of the field lens 308, which can be formed as an integral constituent part of a multi-aperture arrangement 305, it is possible to keep available a curved image surface which accounts for a curved image surface error of the subsequent imaging optical units such as the objective lens 102, for example. Additionally, the prior art has disclosed multi-aperture plates 306 which by way of a plurality of micro-lenses account for a focal area of a curved image surface-type form. A compensator for an image field tilt 330, the electrodes of which are driven by a linear resistor cascade, is contained in the fifth embodiment. Consequently, a linear focal profile in accordance with an image plane tilt is generated, which accounts for the image plane tilt of the downstream beam divider 400. FIG. 11 schematically shows a detail of an example for a compensator for an image plane tilt 330. In this example, the compensator for an image plane tilt 330 is embodied as a multi-aperture plate, including a plurality of openings 332, each of which is surrounded by a ring-shaped electrode 334. The sectional image shows two cross sections of each of the ring electrodes 334. In the y-direction, the ring-shaped electrodes are interconnected by way of resistors, the resistances being chosen proportional to the pitches or positions of the ring-shaped electrodes 334 in the y-direction. An external voltage V therefore drops linearly over the plurality of the electrodes 334 in the y-direction, and so a voltage proportional to the y-position is applied to each ring electrode and each ring electrode 334, when in operation, develops a focusing power that depends linearly on the y-direction. Consequently, the plurality of the particle beams 336.1 to 336.4 passing through the openings 332 during operation are focused into an inclined plane 338. In this case, the inclination of the tilted intermediate image plane 338 can be changed by way of the external voltage, and so the resultant image plane tilt of the beam divider 400 can be variably compensated or accounted for depending on the kinetic energy of the primary beam particles. In this case, it should be considered that the image plane tilt may depend on the optical properties such as the deflection angle and further imaging properties of the beam divider 400 and, in particular, may vary with the kinetic energy of the primary particles 3. Further, attention should be drawn to the fact that the orientation of the tilted image plane 338 can twist as a result of a rotation of the grid arrangement of the plurality of primary beams in a magneto-optic objective lens 102 such that a rotation of the grid arrangement by the objective lens 102 are optionally be accounted for when orienting the compensator for an image plane tilt. In an example, an objective lens 102 is operated with approximately constant imaging performance, and so the rotation of the grid arrangement by the objective lens 102 remains virtually constant and can be predefined. In a further example, the compensator for an image plane tilt 330 includes a first tilt compensator of the above-described form with a first resistor chain in the y-direction and a second tilt compensator of the above-described form which is rotated, for example through 90°, in relation to the first tilt compensator and which consequently has a second resistor chain in the x-direction (xy-axes according FIG. 11). By applying two different voltage signals to the first compensator in the y-direction and to the second compensator in the x-direction, it is possible to set a tilted intermediate image plane with any orientation and a changeable rotation of the image plane tilt by the objective lens 102 can be accounted for.

The compensator for an image plane tilt 330 can be combined with further compensators, for example with a compensator for reducing a curved image surface error or the first and second deflectors 701 and 703 in order to be able to carry out an even more precise setting of a best focal plane and in order to achieve an even better resolution of below 5 nm (e.g., below 4 nm, below 3 nm) over a large number J of primary beams with J>90.

A multi-beam particle microscope 1 according the fifth embodiment includes a multi-beam generation device 305, a beam divider 400 and an objective lens 102 with an axis of symmetry 105 of the objective lens 102, and a positioning device 600 for positioning an object 7, wherein the multi-beam generation device 305 further includes a compensator for an image plane tilt 330, which contains a plurality of J openings 332 in a grid configuration in one plane and is configured, when in operation, to influence a plurality of J primary beams 3, wherein each of the plurality of the J openings 332 is provided with at least one electrode 334 configured, when in operation, to change a focal plane in the propagation direction of a primary beam 336 passing through the opening, wherein the plurality of the electrodes 334 are designed and interconnected such that there is a focal plane change as a linear function of a coordinate in a first direction transverse to the propagation direction of the respective primary beam 336, and wherein the focal plane change is constant in a second direction transverse to the first direction and transverse to the propagation direction of the respective primary beam 336. Here, the propagation direction corresponds to the z-axis and the first direction corresponds to the y-axis in FIG. 11.

Figure 12:
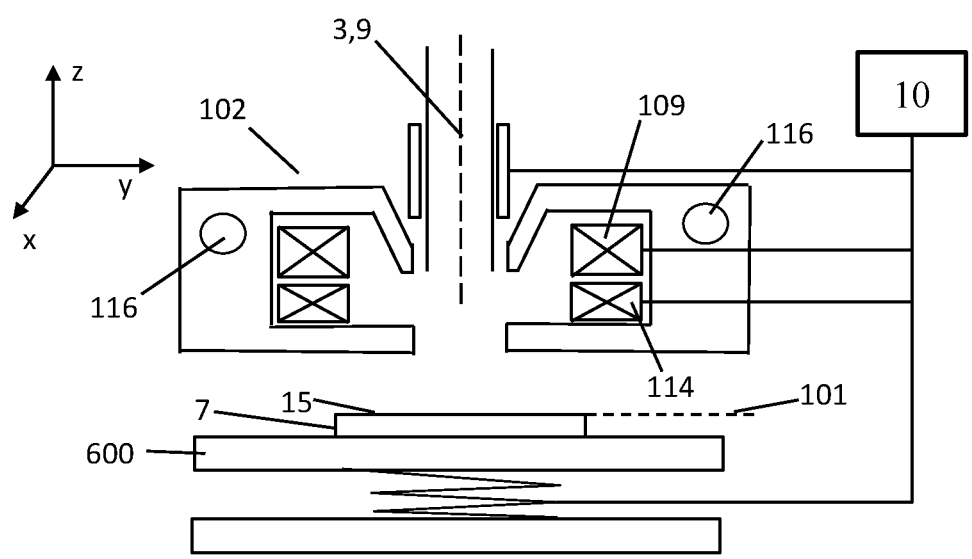
FIG. 12 shows an objective lens with a changeable focal power with unchanging heat output.

An objective lens which facilitates a more precise setting of the optimal focal plane 101 according to any one of the preceding embodiments is specified in a sixth embodiment. The objective lens 102 of the sixth embodiment is illustrated in FIG. 12. The objective lens 102 of the sixth embodiment has a second coil 114 in addition to a first coil 109. Both coils are operated by the control unit 10 with opposing current directions to each other. The change of the focal power P of an objective lens 102 is proportional to the square of the current I, $P=I^2*R$ (where R: value of the resistance; $^2$ means "squared"). However, the temperature or the heat output Q proportional to the resistance R of the coil also increases with the square of the current. Parameters of the objective lens 102 change with a changeable heat output, for example there is a change in the resistance R of the coil. One solution lies in adjusting the cooling power of a coolant which is guided through the cooling channels 116. However, this solution is very complicated. The sixth embodiment specifies a solution which makes do with a constant cooling power by virtue of a constant heat output being obtained, even when the focusing power of the objective lens is changed. In an example, this is achieved by a bifilar additional winding or the second coil 114. The sum of the two coil powers is kept constant by an appropriate supply with a first current I1 for the first coil 109 and a second current I2 for the second coil 114, with $Q=R1*I1^2+R2*I2^2$, while the desired focusing power P of the objective lens 102 can be set very accurately by way of the difference of the two coil powers, by way of $P=R1*I1^2-R2*I2^2$. Consequently, the focal power P or the focusing plane or the first setting plane 101 can be accurately set and the objective 102 can be operated with passive or constant cooling. Constant or passive cooling is attained, for example, by a constant heatsink in the form of a constant through-flow of a coolant such as water through the cooling channels 116 with a constant supply temperature.

The sixth embodiment is therefore given by a multi-beam particle microscope 1 including an objective lens 102 for precisely focusing a plurality of J primary beams 3 in an optimal focal plane 101 with passive cooling 116, wherein the objective lens 102 includes a first coil 109 with a first resistance R1 and a second coil 114 with a second resistance R2, and wherein the objective lens 102 is configured, when in operation, to be operated with a first current I1 and a second current I2, wherein the heat output $Q=I1*I1*R1+I2*I2*R2$ is constant. In an example, the multibeam particle microscope 1 according the sixth embodiment is configured such that, when in operation, a focusing power of the objective lens 102 is adjustable by way of the difference of the two currents I1 and I2 and the magnetic fluxes generated thereby in the coils. By way of example, a focusing power P of the objective lens 102 is adjustable by way of $P=R1*I1^2-R2*I2^2$. In an example, the multi-beam particle microscope 1 according the sixth embodiment is configured such that, when in operation, the magnetic flux of the second coil runs counter to the direction of the magnetic flux of the first coil. In an example of the multi-beam particle microscope 1 according the sixth embodiment, the second coil is arranged counter to the first coil. In an example, the passive cooling 116 of the objective lens 102 of the multi-beam particle microscope 1 is implemented in the form of a contact to a cooling mechanism or a coolant.

A calibration method is made available in a seventh embodiment. The beam angle 78 of the primary beams 3 perpendicular to the surface 15 of a sample 7 is determined using the calibration method of the seventh embodiment. Additionally, further beam parameters for a selected number of primary beams can be determined using the calibration method of the seventh embodiment, for instance the z-profile of the primary beam, the z-extent of the focal region 73, the minimum spot extent and the upper z-position of a focal region 70.1 or the lower z-position of a focal region 70.2 (see FIG. 4). Further beam parameters can be aberrations, for example an astigmatism or a spherical aberration.

A telecentricity error is present if the plurality of the primary beams 3 do not extend parallel to one another and the beam angles 78 of the primary beams 3 are different. Additionally, the mean beam angle of all primary beams can be inclined relative to the z-axis. If the beam angles of all primary beams are virtually the same, this is referred to as a telecentric bundle. In this case, too, the mean beam angle of all primary beams can be inclined relative to a z-axis (see the example in FIG. 9). However, in general, reference is made to a telecentricity error if individual beam angles 78 of the primary beams 3 are not perpendicular to the surface 15 of a wafer 7.

Figure 13:
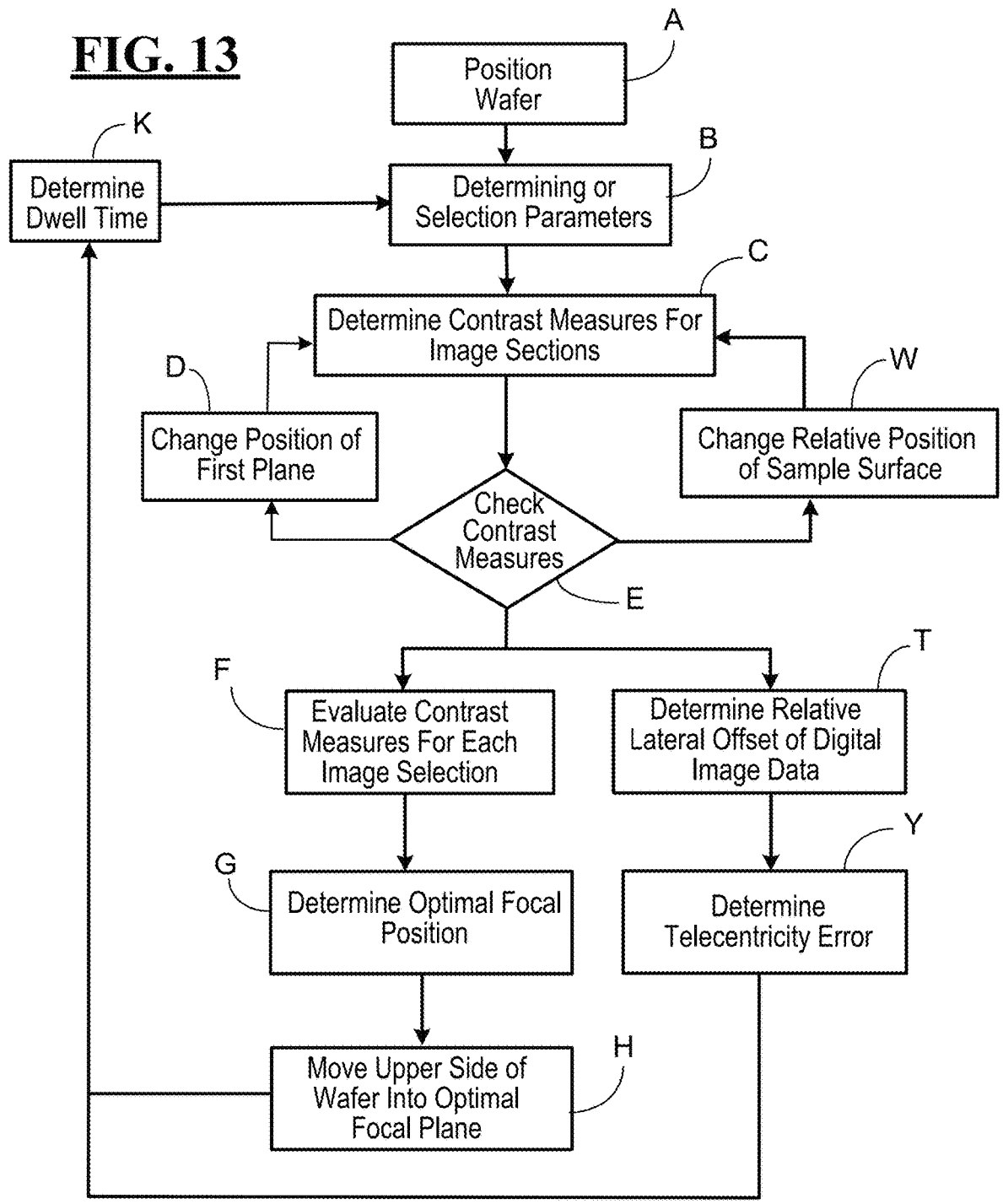
FIG. 13 illustrates a calibration method for determining a telecentricity error.

A calibration method which allows the deviation from a telecentric bundle and the mean beam angle to be determined is made available in the seventh embodiment. FIG. 13 illustrates the steps of the method. The method contains steps A to H, similar to the steps of the first embodiment (FIG. 5), and reference is made to the description of the first embodiment. In addition to, or deviating from, the first embodiment, the digital image data of the L selected image sections are acquired and stored in step C. In a step T, the relative lateral offset of the digital image data of the respective selected image section over the P focal positions is determined for each of the L selected image sections. By way of example, a relative lateral offset between two digital image data of a selected image section can be determined by way of correlation. The l-th beam angle of a l-th primary beam 3 assigned to the l-th selected image section can be determined from the relative lateral offset for each z-position.

In step Y, the beam angles 78 of the plurality of primary beams are evaluated and a telecentricity error is determined. By way of example, a mean beam angle of the primary beams is determined, and a relative deviation of the beam angles of each primary beam from the mean beam angle. Like in the first embodiment, the determination of the beam angles in step T can be implemented for selected primary beams and the beam angles of other primary beams can be derived therefrom, for example by model assumptions. Then, information which is supplied to the control unit 10 of the multi-beam microscope 1 is derived from the determined telecentricity error. This information can include control variables for compensators such as the first or second deflector 701 or 703, for example, or further active elements of the multi-beam microscope 1. In an example, a control variable includes a control signal for the displacement stage 600 in order to compensate a tilt of the displacement stage 600 or a wedge angle of a sample 7. In an example, a control variable includes a control signal for the objective lens 102 or the beam divider 400.

In the context of a curved image surface error or an image plane tilt, a telecentricity error corresponding to the selection of an optimal setting plane according the first embodiment leads to distortion aberration. This distortion aberration can be determined in step Y using simple geometric calculations and can be stored in the control unit 10. In a subsequent evaluation of the digital image data, for example when combining the digital image data from the individual subfields, this distortion aberration can be taken into account.

In order to facilitate a unique determination of the telecentricity error in step Y, it may be advantageous in step W to carry out further changes of the relative position of the sample surface 15 and the setting plane 101 in addition to the change of the focal positions in step D, for example by way of a multiple z-displacement of the wafer using the displacement stage 600, or a multiple change of the actuation signal of the objective lens 102. The use of different elements in step W has the advantage of determining different causes for a telecentricity error, for example. By way of example, a telecentricity error can have the following causes: A tilt of the optical axis of the objective lens 102, a tilt of a component of the objective lens (for example a coil 109 or 114 relative to pole shoe; see FIG. 12), an off-centered profile of the plurality of charged particle beamlets through electromagnetic elements of the multi-beam microscope 1, a wedge angle in a sample or wafer 7, or a tilt of the displacement stage 600 or a z-axis of the displacement stage 600, which is not parallel to the optical axis 105 of the multi-beam microscope 1. By changing the excitation or setting of one of these components it is possible to bring about a change in the telecentricity error and it is possible to derive an optimal setting of the components for a minimal telecentricity error. In addition to determining the beam angle of a primary beam, it is possible to ascertain the z-profile of the primary beam in step Y, for example the minimum spot extent and the upper z-position of the focal region 70.1 or the lower z-position of the focal region 70.2 (see FIG. 4). By way of the asymmetry of the upper z-position of the focal region 70.1 or the lower z-position of the focal region 70.2 it is possible to determine a spherical aberration of a primary beam. By way of example, further beam aberrations can be determined from resolution measurements on HV structures, for example an astigmatism or coma aberration.

In step W, further changes can be undertaken in addition to the change of the focal positions in order to calibrate optical components of the multi-beam microscope. In an example, the actuation signals of the first static deflector 701 are changed, for example in order to calibrate a lateral image offset of the digital image data of the selected image sections. In an example, the actuation signals of the second static deflection 703 are changed in order to change the mean beam angle of all primary beams and in order to calibrate the second static deflector 703. In an example, the actuation signals of the compensator 330 for an image plane tilt are changed in order to tilt the image plane in order to calibrate the compensator 330 for an image plane tilt.

In an example, a first calibration method according the seventh embodiment is implemented on a calibration object which may be arranged on the displacement stage 600, and the multi-beam microscope 1 is adjusted using the calibration object. In step A, the positioning of the surface 15 of the calibration object in the first plane 101 then is implemented instead of the positioning of the surface 15 of a sample 7. In an example, the first calibration method on a calibration object is followed by a second calibration method according the seventh embodiment on the sample or the wafer 7, and a tilt or a wedge angle of the sample 7 is determined. By way of example, a wafer surface 15 can be tilted in relation to the surface of a calibration object. In this case, a constant beam tilt 78 of all primary beams is expected. If the beam tilt of individual primary beams 3 deviates significantly from the expected constant beam tilt, a different aberration is present and the first calibration or a correction of beam aberrations of primary beams is carried out. The measurement according the calibration method of the seventh embodiment can be assisted by further sensors in this case, such as for example a sensor system of the displacement stage 600 or a distance sensor between the sample surface 15 and a reference surface.

In an example, the z-profile of the primary beams 3 is determined; by way of example, the z-extent of the focal regions 73, the minimum spot extent and the upper z-position of the focal region 70.1 or the lower z-position of the focal region 70.2 are determined for each selected primary beam (see FIG. 4). The determined variables are stored in the control unit 10 of the multi-beam microscope 1 and used, for example, for determining the optimal setting plane in the method according the first embodiment.

A method according the seventh embodiment for calibrating a multi-beam particle microscope 1 with a plurality of J primary beams 3, includes the steps of:

A. positioning a surface 15 of an object 7 using a displacement stage 600 in a first setting plane 101 with a first z-position z1;

B. determining suitable parameters for a focusing series with z-positions zi with i=1 to P;

C. acquiring digital image data for the first and each further one of the i=1 to P z-positions for a plurality of L selected primary beams and storing the digital image data in a memory unit 290;

D. displacing the first setting plane 101 into a second or further setting plane at a second or further z-position z2 to zP;

E. repeating steps C and D until digital image data are acquired for each of the z-positions z1 to zP;

T. determining a relative lateral offset from the digital image data for each l-th selected primary beam over at least two different z-positions in each case and determining each l-th beam angle 78 of the l-th selected primary beam from the relative lateral offset and the distance between two different z-positions;

Y. evaluating the L beam angles 78 of the plurality of the L selected primary beams and determining a telecentricity error of the multi-beam particle microscope 1.

In a method according the seventh embodiment, step Y further includes the determination of a mean beam angle and a relative deviation of the beam angles of the selected primary beams from the mean beam angle.

A method according the seventh embodiment further includes the calculation of control signals from the telecentricity error and a feed of the control signals to a control unit of the multi-beam microscope 1, wherein the control signals contain at least one control signal for an objective lens 102, a beam divider 400, a deflector 703, or for a displacement stage 600.

A method according the seventh embodiment further includes the determination of a z-profile of at least one selected primary beam 3, including at least a determination and storage of a variable selected from an optimal focal position 68 of the selected primary beam, a z-extent 73 of a focal region of the selected primary beam, a minimum spot extent 74, or an upper z-position of a focal region 70.1 or a lower z-position of a focal region 70.2 of the selected primary beam.

The steps of the methods according the first and seventh embodiment overlap in part or complement one another. The method of the seventh embodiment can therefore be carried out in parallel or simultaneously with the method of the first embodiment, with the elements of steps B and C being combined. FIG. 13 illustrates this by the sequence of steps F, G and H according the first embodiment parallel to steps T and Y according the seventh embodiment.

In an example, a curved image surface error and an image plane tilt according the first embodiment is determined from the best focal planes 68 of each primary beam and deviations of individual primary beams from the mean curved image surface and image plane tilt are measured. In an example, the deviation of a best focal plane 68 of an individual primary beam from the curved image surface error and an image plane tilt or an aberration of an individual primary beam is greater than a predefined threshold. The deviation is measured by the control unit 10 of the multi-beam microscope 1. By way of example, the control unit 10 can then trigger cleaning or maintenance of the multi-beam microscope 1.

The disclosure can further be described by following clauses:

Clause 1. A method for setting an optimal focal plane in a multi-beam particle microscope with a multi-beam generation device 305 for generating a first plurality of J primary beams 3, wherein the first plurality of J primary beams 3 are arranged in a grid arrangement and each primary beam can be deflected in each case over an associated sub-field 31 in an image field 17 by way of a scan deflector 500, and with a detector system 200 having a particle multi-detector 209 and a data acquisition device 280, including:
A) positioning a surface 15 of an object 7 using a displacement stage 600 in a first setting plane 101 with a first z-position z1;
B) determining suitable parameters for a focusing series with z-positions zi with i=1 to P;
C) measuring L contrast measures K1(i) to KL(i) for L<=J selected primary beams 3;
D) displacing the first setting plane 101 into a second or further setting plane at a second or further z-position z2 to zP;
E) repeating steps C and D until contrast measures K1(i) to KL(i) with i=1 to P are measured for each of the z-positions z1 to zP;
F) determining L best focal positions 68 for each of the L selected primary beams 3 using the contrast measures K1(i);
G) determining a curved image surface error and an image plane tilt from the L best focal positions 68 and determining an optimal focal plane of the multi-beam particle microscope 1 such that a predefined resolution criterion is met for a second plurality of J2 primary beams with J2>=0.9×J;
H) storing the optimal focal plane as new first setting plane 101 of the multi-beam particle microscope 1.

Clause 2. The method according clause 1, wherein step B includes the following elements:
the determination of an image section 37 within each of the J sub-fields 31;
the selection of L selected image sections 39.1 to 39.L from the image sections 37 for each of the J sub-fields 31, where L<=J is chosen; and wherein a selected primary beam 3 is assigned to each of the L selected image sections 39;
the definition of parameters for an acquisition of the digital image data of the sections of the surface 15 of the object 7 arranged within the image sections 39;
the definition of the series of P z-positions z1 to zP with (P−1) increments dz(2) to dz(P) between two successive z-positions z(1) to z(P) in each case.

Clause 3. The method according clause 2, wherein the image section 37 is determined within the J sub-fields 31 on the basis of a surface condition or on the basis of structures on the surface 15 of the object 7.

Clause 4. The method according clause 2 or 3, wherein the number L of the selected image sections is at least four.

Clause 5. The method according clause 4, wherein the data acquisition device 280 has a number R of image digitizers 285.1 to 285.R arranged in parallel, and the number L of selected sections is chosen to equal R.

Clause 6. The method according any one of the preceding clauses, wherein the number P of z-positions is defined in a range between P=3 and P=7.

Clause 7. The method according any one of the preceding clauses, wherein step B contains defining a method for determining a contrast measure, including at least one of the following methods: a spectral process, an image contrast, a histogram process, an edge filter, a method of relative distribution, or a gradient process.

Clause 8. The method according any one of the preceding clauses, wherein step C includes the following elements:
acquiring L digital image data of the L selected image sections 39 within the J sub-fields 31 using the detector system 200 in accordance with the parameters defined in step B;
evaluating the L selected image sections 39.1 to 39.L and determining L contrast measures K1(i), . . . , KL(i) with the data acquisition device 280;
transmitting the L contrast measures K1(i) to KL(i) to a control unit 10 and storing the L contrast measures K1(i) to KL(i).

Clause 9. The method according any one of the preceding clauses, wherein step E further includes a check as whether each of the determined contrast measures meets a criterion and, if the criterion is not met, at least one further z-position z(P+1) is determined, followed by repetition of step D with a displacement of the first setting plane 101 into the further z-position z(P+1) and by a repetition of step C at the further z-position z(P+1).

Clause 10. The method according any one of the preceding clauses, wherein an upper or lower admissible focal deviation of the L selected primary beams 3 is further determined in step G.

Clause 11. The method according any one of the preceding clauses, wherein the displacement of the first setting a plane 101 in step D is implemented by changing the actuation of an objective lens 102 or by changing the z-position of the surface 15 of the object 7 by way of the displacement stage 600 or by changing a sample voltage 605 or by a combination of at least two of the aforementioned changes.

Clause 12. The method according clause 11, wherein the change in the actuation of an objective lens 102 includes changing two actuation signals such that the sum of the squares of a first and a second current remains constant and the difference of the squares of the first and the second current is changed.

Clause 13. The method according any one of the preceding clauses, further including an determination of an actuation signal for a compensator for an image plane tilt, and feeding the actuation signal to the compensator for the image plane tilt.

Clause 14. The method according clause 13, wherein the actuation signal includes a focusing signal for a compensator for an image plane tilt 330, arranged in the multi-beam generation device 300.

Clause 15. The method according any one of the preceding clauses, further including the determination of an actuation signal for a compensator for a curved image surface error, and feeding the actuation signal to the compensator for the curved image surface error.

Clause 16. The method according any one of the preceding clauses, further including a determination of a displacement vector 59, and wherein an actuation signal which is fed to a displacement device for the grid arrangement of the plurality of the J primary beams 3 is determined from the displacement vector 59.

Clause 17. A multi-beam particle microscope 1, including a control unit 10, a data acquisition device 280, an image data memory 290 and a beam deflector 500, wherein the control unit 10 and the data acquisition device 280 are configured such that they are switchable from a first mode of operation to a second mode of operation, wherein the control unit 10, the scan deflector 500 and the data acquisition device 280 are configured in the first mode of operation to ascertain a contiguous digital image of an object surface 15 arranged in an image field 17 of the multi-beam particle microscope 1 and store the contiguous digital image in the image data memory 290, and are configured in the second mode of operation to acquire and evaluate selected digital image data of an object surface 15 arranged in an image field 17 of the multi-beam particle microscope 1.

Clause 18. The multi-beam particle microscope 1 according clause 17, wherein the control unit 10, the scan deflector 500 and the data acquisition device 280 are configured in the second mode of operation to carry out a method according any one of clauses 1 to 16.

Clause 19. The multi-beam particle microscope 1 according clause 17 or 18, further including an actuation system which at least includes a displacement stage 600 or an objective lens 102.

Clause 20. The multi-beam particle microscope 1 according any one of clauses 17 to 19, further including at least one multi-beam generation device 305 with a compensator for an image field tilt 330.

Clause 21. The multi-beam particle microscope 1 according any one of clauses 17 to 20, further including a compensator for a tilt of the primary beams 703 or a tilt device 610 for the displacement stage 600.

Clause 22. The multi-beam particle microscope 1 according any one of clauses 17 to 21, wherein the data acquisition device 280 contains a plurality of R image digitizers 285.1 to 285.R connected in parallel, and the image digitizers 285.1 to 285.R are configured in the second mode of operation to acquire image data of L=R selected sections and calculate L=R contrast measures from the image data of the L=R selected sections.

Clause 23. The multi-beam particle microscope 1 according clause 22, wherein the control unit 10 is further configured to calculate an image plane tilt from the R contrast measures.

Clause 24. The multi-beam particle microscope 1 according clause 23, further including a multi-beam generation device 305, wherein the multi-beam generation device 305 contains a compensator 330 for the calculated image plane tilt, wherein the compensator 330 contains a plurality of J openings 332 in a grid configuration in one plane and is configured, when in operation, to influence a plurality of J primary beams 3 in a grid configuration, wherein each of the plurality of the J openings 332 is provided with at least one electrode 334 configured, when in operation, to change a focal plane in the propagation direction of a primary beam 336 passing through the opening, wherein the plurality of the electrodes 334 are designed and interconnected such that there is for each primary beam 336 a focal plane change as a linear function of a coordinate in a first direction transverse to the propagation direction of the respective primary beam 336, and wherein the focal plane change in the respective primary beam 336 is constant in a second direction transverse to the first direction and transverse to the propagation direction.

Clause 25. A method for calibrating a multi-beam particle microscope 1 with a plurality of J primary beams 3, including the steps of:
A) positioning a surface 15 of an object 7 using a displacement stage 600 in a first setting plane 101 with a first z-position z1;
B) determining suitable parameters for a focusing series with z-positions zi with i=1 to P;
C) acquiring digital image data for the first and each further one of the i=1 to P z-positions for a plurality of L selected primary beams and storing the digital image data in a memory unit 290;
D) displacing the first setting plane 101 into a second or further setting plane at a second or further z-position z2 to zP;
E) repeating steps C and D until digital image data are acquired for each of the z-positions z1 to zP;
T) determining a relative lateral offset from the digital image data for each l-th selected primary beam over at least two different z-positions in each case and determining each l-th beam angle 78 of the l-th selected primary beam from the relative lateral offset and the pitch between two different z-positions;
Y) evaluating the L beam angles 78 of the plurality of the L selected primary beams and determining a telecentricity error of the multi-beam particle microscope 1.

Clause 26. The method according clause 25, wherein step Y contains the determination of the mean beam angle and a relative deviation of the beam angles of the selected primary beams from the mean beam angle.

Clause 27. The method according clause 25 or 26, further including the calculation of control signals from the telecentricity error and a feed of the control signals to a control unit of the multi-beam microscope 1, wherein the control signals control at least one control signal for an objective lens 102, a beam divider 400, a deflector 703, or for a displacement stage 600.

Clause 28. The method according any one of clauses 25 to 27, including the determination of a z-profile of at least one selected primary beam 3, including at least a determination and storage of a variable selected from an optimal focal position 68 of a selected primary beam, a z-extent 73 of a focal region of a selected primary beam, a minimum spot extent 74, or an upper z-position of a focal region 70.1 or a lower z-position of a focal region 70.2 of a selected primary beam.

The illustrated embodiments, examples and clauses can be combined with one another in full or in part, provided that no technical contradictions arise as a result. Incidentally, the illustrated embodiments should not be construed as constrictive for the disclosure.

LIST OF REFERENCE SIGNS

1 Multi-beam particle beam system
3 Primary particle beams
5 Incidence locations on a surface of an object
7 Object; wafer
9 Secondary particle beams
10 Control system
11 Particle beam path for secondary particles
15 Sample surface
17 Image field
21 Center of an image field
27 Scan path
31 Sub-field
33 First inspection site
35 Second inspection site
37 Image section
39 Selected image section
41 y-axis through the focal position of the axial primary beam
43 Center
45 Tilted image plane
47 Lower focal plane
49 Upper focal plane
51 z-extent or interval
53 Approximately concentric rings with focal points with a similar resolution
55 Beam with the lowest focal point
57 Rejected primary beams which do not meet a resolution criterion.
59 Offset in the y-direction
60 Optical axis or z-axis
61 Center beam
62 Beam cone of a primary beam in the vicinity of the focal plane
64 Aperture angle
65 Approximated beam profile
68 Best focal plane
70.1, 70.2 Upper and lower plane of the focal region
72 Upper and lower admissible focal deviations
73 z-extent of the focal range
74 Minimal spot extent
76.1, 76.2 Predefined resolution limit or resolution criterion
78 Beam angle with respect to the z-axis
80 Centroid ray
82 Beam cone of a tilted primary beam in the vicinity of the focal plane
100 Objective lens system
101 First plane
102 Objective lens
103 Grid arrangement of incidence locations 5
109 Coil or first coil
114 Second coil
116 Cooling channel
200 Detector system
205 Projection lens
208 Electrostatic element
209 Particle multi-detector
211 Plane with detection regions
213 Incidence locations of the secondary particle beams
217 Grid arrangement of incidence locations
222 Collective scan deflector
260 Electrostatic element
280 Data acquisition device
285 Image digitizer
290 Memory
300 Beam generation apparatus
301 Particle source
303 Collimation lens or collimation lens system
305 Multi-aperture arrangement
306 Multi-aperture plates
307 Field lens or field lens arrangement
309 Diverging particle beam
311 Collimated beam
313 Multi-aperture plate
315 Openings or apertures
317 Midpoints of the apertures
319 Grid arrangement of apertures
323 Beam focal points
325 Intermediate image plane
330 Compensator for an image plane tilt
332 Plurality of openings
334 Ring-shaped electrodes
336 Passing particle beams
338 Tilted focal plane
400 Beam divider
460 Beam tube arrangement
461 First limb of the beam tube arrangement
462 Second limb of the beam tube arrangement
463 Third limb of the beam tube arrangement
410 First magnetic sector
420 Second magnetic sector
500 Scan deflector
600 Displacement stage or positioning device
605 Sample potential or feed line for a sample potential
610 Tilt device
701 First static deflector
703 Second static deflector

What is claimed is:

1. A method of operating a multi-beam particle microscope comprising a multi-beam device configured to generate primary beams, comprising:
  A) positioning a surface of an object in a first setting plane with a first z-position z1;
  B) determining parameters for a focusing series with z-positions zi with i=1 to P;
  C) generating J primary beams with the multi-beam generation device of the multi-beam particle microscope, projecting the J primary beams onto a specimen, detecting the secondary electrons emitted by the specimen to form an image, selecting L primary beams, selecting a contrast measure, extracting the sections of the image resulting from the L primary beams, and calculating contrast measures K1(i) to KL(i) for the L selected primary beams, L being less than or equal to J;
  D) displacing the first setting plane into a second or further setting plane at a second or further z-position z2 to zP;
  E) repeating C) and D) until contrast measures K1(i) to KL(i) with i=1 to P are measured for each of the z-positions z1 to zP;
  F) determining a focal position for each of the L selected primary beams by finding the z-position at which the contrast measure K1(i) is maximized; and
  G) determining a curved image surface and an image plane tilt from the L focal positions; and
  H) determining an actuation signal for a compensator for an image plane tilt, and providing the actuation signal to the compensator for the image plane tilt, wherein C) comprises measuring L contrast measures K1(i) to KL(i) for the L selected primary beams comprises a method selected from the group consisting of:
i) using a one-dimensional Fourier transform perpendicular to an edge of an image field;
ii) using a normalized maximum of ratios of two pixels spaced from each other in an image section;
iii) using a histogram from a grayscale value distribution of selected image sections;
iv) comparing differences of each pair of pixel values in an image section to a threshold;
v) using a normalized sum of all scalar gradients which are based on differences of adjacent pixels in an image section;
vi) using a normalized maximum value of local gradients which are based on differences of adjacent pixels in an image section; and
vii) selecting a first derivative of digital image data from an image section, convolving the digital image data with a point spread function, calculating a second derivative of the convolved digital image data, and determining a ration of the first and second derivatives.

2. The method of claim 1, wherein each of the J primary beams has an associated sub-field so that there are J sub-fields, and B) comprises:
determining an image section within each of the J sub-fields;
selecting L image sections from the image sections for each of the J sub-fields, and a selected primary beam is assigned to each of the L selected image sections;
defining parameters for an acquisition of the digital image data of the sections of the surface of the object arranged within the image sections; and
defining the series of P z-positions z1 to zP with (P−1) increments dz(2) to dz(P) between two successive z-positions z(1) to z(P) in each case.

3. The method of claim 2, wherein the image section is determined within the J sub-fields on the basis of a surface condition or on the basis of structures on the surface of the object.

4. The method of claim 2, wherein the number L of the selected image sections is at least four.

5. The method of claim 4, wherein the multi-beam particle microscope comprises a data acquisition device comprising a number R of image digitizers arranged in parallel, and R=L.

6. The method of claim 1, wherein the number P is from 3 to 7.

7. The method of claim 1, wherein B) comprises defining a method for determining a contrast measure comprising at least one member selected from the group consisting of a spectral process, an image contrast, a histogram process, an edge filter, a method of relative distribution, and a gradient process.

8. The method of claim 1, wherein each of the J primary beams has an associated sub-field so that there are J sub-fields, and C) comprises:
acquiring digital image data of the L selected image sections within the J sub-fields with the parameters defined in B);
evaluating the L selected image sections and determining L contrast measures K1(i), . . . , KL(i); and
storing the L contrast measures K1(i) to KL(i).

9. The method of claim 1, wherein E) further comprises:
checking whether each of the determined contrast measures meets a criterion; and
when the criterion is not met, determining at least one further z-position z(P+1), followed by repeating D) with a displacement of the first setting plane into the further z-position z(P+1) and repeating C) at the further z-position z(P+1).

10. The method of claim 1, wherein G) comprises determining an upper or lower admissible focal deviation of the L selected primary beams.

11. The method of claim 1, wherein displacing the first setting a plane in D) comprises at least one of: changing an actuation of an objective lens of the multi-beam particle microscope; changing the z-position of the surface of the object; and changing a sample voltage.

12. The method of claim 11, wherein changing the actuation of the objective lens comprises changing two actuation signals so that a sum of squares of a first and a second current remains constant and a difference of the squares of the first and the second current is changed.

13. The method of claim 1, wherein the actuation signal comprises a focusing signal for a compensator for an image plane tilt.

14. The method of claim 1, further comprising determining an actuation signal for a compensator for a curved image surface, and providing the actuation signal to the compensator for the curved image surface.

15. One or more machine-readable hardware storage devices comprising instructions that are executable by one or more processing devices to perform operations comprising the method of claim 1.

16. A system comprising:
one or more processing devices; and
one or more machine-readable hardware storage devices comprising instructions that are executable by the one or more processing devices to perform operations comprising the method of claim 1.

* * * * *